United States Patent
Ito et al.

(10) Patent No.: US 8,592,283 B2
(45) Date of Patent: Nov. 26, 2013

(54) WIRING STRUCTURE, SEMICONDUCTOR DEVICE AND MANUFACTURING METHOD THEREOF

(75) Inventors: Fuminori Ito, Tokyo (JP); Yoshihiro Hayashi, Tokyo (JP); Tsuneo Takeuchi, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 0 days.

(21) Appl. No.: 13/137,622

(22) Filed: Aug. 30, 2011

(65) Prior Publication Data

US 2011/0318926 A1    Dec. 29, 2011

Related U.S. Application Data

(62) Division of application No. 11/991,939, filed as application No. PCT/JP2006/318799 on Sep. 15, 2006, now Pat. No. 8,039,921.

(30) Foreign Application Priority Data

Sep. 16, 2005 (JP) ................................. 2005-270355
Jul. 20, 2006 (JP) ................................. 2006-198752

(51) Int. Cl.
*H01L 21/70* (2006.01)
(52) U.S. Cl.
USPC .......................................... 438/408; 438/409
(58) Field of Classification Search
USPC .................................................. 438/408, 409
See application file for complete search history.

(56) References Cited

U.S. PATENT DOCUMENTS

| 6,207,555 | B1 | 3/2001 | Ross |
| 6,670,709 | B2 | 12/2003 | Usami |
| 7,030,468 | B2 | 4/2006 | Gates et al. |
| 7,091,618 | B2 | 8/2006 | Yoshizawa et al. |
| 7,094,681 | B2 | 8/2006 | Fujita et al. |

(Continued)

FOREIGN PATENT DOCUMENTS

| JP | 2000-183052 | 6/2000 |
| JP | 2001-85522 | 3/2001 |

(Continued)

OTHER PUBLICATIONS

Hayashi Y. et al., "Novel molecular-structure design for PECVD porous SiOCH films toward 45nm node, ASICs with K=2.3." In: Proceedings of the IEEE 2004 International Interconnect Technology Conference, 2004, p. 225-227 p. 1178-1184.

(Continued)

*Primary Examiner* — Long Pham
*Assistant Examiner* — Steven Rao
(74) *Attorney, Agent, or Firm* — McGinn Intellectual Property Law Group, PLLC

(57) ABSTRACT

A semiconductor device manufacturing method for manufacturing a semiconductor device having a transistor mounted in a wiring of a plural-layer structure includes in manufacturing the semiconductor device that is formed on a semiconductor element and includes a barrier insulating film, a porous interlayer insulating film, a wiring, a via plug formed by embedding a metal wiring material in a wiring trench, and a via hole formed in the porous interlayer insulating film, irradiating an electron beam or an ultraviolet ray onto at least a portion of the porous interlayer insulating film before forming an opening in the barrier insulating film.

16 Claims, 20 Drawing Sheets

(56) References Cited

U.S. PATENT DOCUMENTS

| | | |
|---|---|---|
| 7,270,849 B2 | 9/2007 | Hayashi |
| 7,282,458 B2 | 10/2007 | Gates et al. |
| 2001/0017402 A1 | 8/2001 | Usami |
| 2004/0029386 A1 | 2/2004 | Lee et al. |
| 2004/0091419 A1* | 5/2004 | Ogihara et al. ............... 423/702 |
| 2005/0156285 A1 | 7/2005 | Gates et al. |
| 2005/0267253 A1 | 12/2005 | Hayashi |
| 2006/0055004 A1 | 3/2006 | Gates et al. |
| 2007/0108593 A1 | 5/2007 | Ogihara et al. |
| 2007/0157884 A1 | 7/2007 | Hayashi |

FOREIGN PATENT DOCUMENTS

| | | |
|---|---|---|
| JP | 2001-223269 | 8/2001 |
| JP | 2004-47873 | 2/2004 |
| JP | 2004-96080 | 3/2004 |
| JP | 2004-096080 A | 3/2004 |
| JP | 2004-158704 A | 6/2004 |
| JP | 2004-193326 | 7/2004 |
| JP | 2004-221104 | 8/2004 |
| JP | 2004-221104 A | 8/2004 |
| JP | 2004-274052 | 9/2004 |
| JP | 2005-51192 | 2/2005 |
| JP | 2005-051192 A | 2/2005 |
| JP | 2005-79307 | 3/2005 |
| JP | 2005-142433 | 6/2005 |
| JP | 2005-142433 A | 6/2005 |
| JP | 2005-197606 A | 7/2005 |
| JP | 2005-203794 | 7/2005 |

OTHER PUBLICATIONS

Yoshihiro Hayashi, "Tei Yudenritsu Zetsuenmaku Zairyo no Shinka to Saisentan ULSI Taso Haisen Gijutsu", Oyo Butsuri, Sep. 10, 2005, vol. 74, No. 9, pp. 1178 to 1184.

Japanese Office Action dated Sep. 26, 2012 with a partial English translation thereof.

* cited by examiner

WIRING STRUCTURE, SEMICONDUCTOR DEVICE AND MANUFACTURING METHOD THEREOF

The present application is a Divisional Application of U.S. patent application Ser. No. 11/991,939, filed on Mar. 13, 2008 now U.S. Pat. No. 8,039,921, which is based on and claims priority from International Application No. PCT/JP2006/318799 filed Sep. 15, 2006, which is based on and claims priority from Japanese Patent Application Nos. 2006-198752 and 2005-270355, filed on Jul. 20, 2006 and Sep. 16, 2005, respectively, the entire contents of which are incorporated herein by reference.

TECHNICAL FIELD

This invention relates to a semiconductor device and a manufacturing method thereof and, in particular, relates to a wiring structure forming multilayer wiring (plural-layer wiring), a semiconductor device and its manufacturing method.

BACKGROUND ART

Following high integration and miniaturization of semiconductor elements in recent years, there has been developed a semiconductor device using, as a wiring interlayer insulating film (hereinafter referred to as an interlayer insulating film), an insulating film having a permittivity lower than that of a conventional silicon oxide film. For example, there have been developed an interlayer insulating film obtained by substituting a part of oxygen atoms contained in a silicon oxide film by fluorine, hydrogen, or a chemical species containing carbon and hydrogen, such as a methyl group, and an interlayer insulating film obtained by forming fine pores in one of those films to achieve a reduction in permittivity. Particularly, the porous interlayer insulating film introducing the fine pores is quite effective for reducing the permittivity and thus can reduce the parasitic capacitance in multilayer wiring. In view of this, the multilayer wiring with porous interlayer insulating films introduced therein is expected to be widely applied to supercomputers and digital home appliances requiring high calculation speeds, mobile devices such as portable telephones requiring low power consumption, and so on.

FIG. 30 shows a multilayer wiring manufacturing method using porous interlayer insulating films according to a prior art. On a Cu wiring layer (not shown) formed in advance, a barrier insulating film 1 of SiCN or the like having diffusion barrier properties to Cu, a via interlayer insulating film 2, an etching stopper 3 of $SiO_2$ or the like, a wiring interlayer insulating film 4, and a hard mask 5 of $SiO_2$ or the like are stacked in the order named (FIG. 30, (a)). Then, as shown in FIG. 30, (b), dual-damascene trenches each comprising a wiring trench 6 and a via hole 7 are formed using photoresists and reactive etching. Dual-damascene trench forming methods include a via-first process in which a via is first formed and then a photoresist is coated over the formed via to thereby form a wiring trench and a trench-first process in which a wiring trench is first formed and then a photoresist is coated over the formed wiring trench to thereby form a via hole. Then, as shown in FIG. 30, (c), after etch-back of the barrier insulating film 1 at the bottom of the via holes 7, a barrier metal 10 of Ta/TaN or the like is deposited on the inner walls of the openings and the entire surface of the hard mask 5 and then a Cu film 11 is deposited thereon by an electrolytic plating method. The excess portions, deposited on the hard mask, of the barrier metal and the Cu film are removed and flattened by a CMP (Chemical Mechanical Polishing) process (FIG. 30, (d)).

With respect to the multilayer wiring structure using porous interlayer insulating films, various problems on the process and device reliability have been actualized and there have been many proposals for overcoming them.

For example, as shown in FIG. 31, with respect to the side wall of the porous interlayer insulating film 23 (the via interlayer insulating film 2 or the wiring interlayer insulating film 4) after the formation of the opening by the etching, the coating and adhesion of the barrier metal 10 are lowered due to the influence of exposed pore portions 19. This causes degradation of the device properties due to diffusion of water, various process gases, or Cu. For this problem, in Japanese Unexamined Patent Application Publication (JP-A) No. 2004-193326 (Patent Document 1), pores exposed on the side wall of a wiring trench after etching are blocked by nonporous polyarylether to improve the coating of a barrier metal, thereby suppressing diffusion of Cu into a porous interlayer insulating film. Similarly, in Japanese Unexamined Patent Application Publication (JP-A) No. 2001-85522 (Patent Document 2), an atomic group bulkier than a hydroxyl group is impregnated into pores exposed on the side wall of a porous interlayer insulating film after etching, thereby suppressing the flow of metal, water, or gas into the film through the pores.

Japanese Unexamined Patent Application Publication (JP-A) No. 2000-183052 (Patent Document 3) describes, as a technique for increasing the adhesion between an interlayer insulating film and an underlying substrate, a manufacturing method that applies a physical impact, i.e. reverse sputtering, to the lower-layer substrate for the interlayer insulating film to form dangling bonds on the surface of the underlying substrate, thereby improving the adhesion thereof to the interlayer insulating film formed thereon. Further, the Patent Document 3 describes, as an adhesion improving method, a method of inserting a silicon oxide film or a silicon nitride film as an adhesive layer between an interlayer insulating film and an underlying substrate.

Japanese Unexamined Patent Application Publication (JP-A) No. 2005-79307 (Patent Document 4) discloses a porous interlayer insulating film manufacturing method that bakes a coated film by irradiating an electron beam for the purpose of strengthening the porous interlayer insulating film. In the above Patent Document 4, a film strength (elastic modulus) of 15 GPa is achieved in a porous interlayer insulating film having a pore size of about 1.5 nm.

DISCLOSURE OF THE INVENTION

Problem to be Solved by the Invention

However, semiconductor devices formed by these prior arts have the following problems.

The first problem is diffusion of water, etching gas, or metal into a porous interlayer insulating film. Water is a molecule with an extremely high polarizability (relative permittivity is about 70) and, therefore, if taken into the film through pores, the permittivity largely increases. If a fluorine-based etching gas permeates into the film, it reacts with water or the like in the film to form hydrogen fluoride so that large voids are formed in the porous interlayer insulating film, or it is released again after wiring formation to cause corrosion of a metal wiring material such as Cu. Further, if a metal such as Cu is diffused into the interlayer insulating film through pores, it causes degradation of the wiring reliability such as an increase in leakage current.

The Patent Documents 1 and 2 are conceived for solving these problems. In the prior art described in the Patent Document 1, since the pores exposed on the side wall of the trench after the etching are blocked by the nonporous polyarylether, it is effective for improving the coating of the barrier metal. However, such an embedded material is poor in adhesion to the barrier metal and, thus, as the thermal cycle history increases in the process, stripping occurs to cause formation of pinholes. Particularly, since the same process is repeated a plurality of times in the multilayer wiring forming process, a wiring portion formed in a lower layer in advance is subjected to a thermal history in proportion to the number of wiring layers and, thus, pinholes are more liable to occur.

In the Patent Document 2, a compound capable of supplying an atomic group such as $Si(NCO)_4$ bulkier than an OH group is supplied in a gas state at a temperature of 20° C. to the pores exposed on the side wall of the porous interlayer insulating film after the etching, thereby blocking the pores. However, there is a possibility that the atomic group proceeding into the pores further proceeds to the inside of the film through pores. That is, many of the pores introduced for reducing the permittivity are filled with a combination of silicon, oxygen, and nitrogen having a high polarizability, which thus causes a large increase in permittivity of the interlayer insulating film. Further, since such a bulky atomic group is chemically unstable as compared with peripheral materials, there is a possibility that it is desorbed during the multilayer wiring process so as to be a supply route of water or gas again. Further, in the foregoing Patent Documents 1 and 2, the pores of the side wall are blocked without removing an etching gas absorbed in the film. Consequently, fluorine remaining in the film causes formation of voids in the porous interlayer insulating film or is released again during the multilayer wiring process to cause corrosion of a wiring material.

The second problem is degradation of the adhesion between a porous interlayer insulating film and an adjacent film. The multilayering of the wiring structure adapted to the miniaturization and integration of transistors increases stress concentration at the interface between different kinds of materials forming a laminated film. Therefore, the adhesion between particularly a porous interlayer insulating film and a film adjacent thereto tends to degrade. In terms of the process, the adhesion between a hard mask and a porous interlayer insulating film in the CMP process is important. Further, since large stresses are applied also in semiconductor element mounting processes such as dicing, packaging, and wire bonding, the improvement in adhesion strength is an important subject.

The Patent Document 3 is conceived for solving these problems. In the prior art described in the Patent Document 3, the silicon oxide film or the silicon nitride film is inserted as the adhesive layer at the interface between the underlying substrate and the interlayer insulating film. However, this adhesive layer is made of a material with an extremely high permittivity and thus largely increases the effective permittivity of the entire wiring structure. It further discloses the process of forming silicon dangling bonds on the underlying substrate. However, since the substrate is opened to the atmosphere for forming the interlayer insulating film after the formation of the dangling bonds, the silicon oxide film is resultantly formed on the surface of the underlying substrate, thus increasing the permittivity.

The third problem is degradation of a film strength. Since pores are introduced in a porous interlayer insulating film, the film strength is inevitably degraded. As described above, in the multilayering of wiring and the mounting processes such as bonding, the strong stresses and mechanical impacts are applied to the inside of the wiring structure. Therefore, the mechanically weak porous interlayer insulating film is subjected to film breakage. The Patent Document 4 is conceived for solving these problems. The prior art described in the Patent Document 4 largely shortens the baking time of the coated film by the use of the electron-beam irradiation and, further, realizes the increase in strength. However, the pore formation by the coated film volatilizes volatile molecules to serve as nuclei of pores at the baking stage. Accordingly, there is a drawback that the pores tend to be through holes and thus the pore size control is difficult. That is, the gas, water, or metal diffusion effect is large. Therefore, it becomes difficult to improve the film strength and simultaneously suppress the diffusion phenomenon due to the pores.

As described above, there has not been proposed a wiring structure, a semiconductor device or its manufacturing method that can simultaneously satisfy the three subjects, i.e. the suppression of the diffusion phenomenon due to the pores, the improvement in adhesion, and the improvement in film strength.

This invention has been made in view of the foregoing problems and has an object to provide a highly reliable semiconductor device avoiding a diffusion phenomenon otherwise caused by pores of a porous interlayer insulating film, degradation of the adhesion to an adjacent film, and degradation of a film strength without increasing the effective permittivity of the semiconductor device, and a manufacturing method thereof.

Means for Solving the Problem

In order to accomplish the above object, a wiring structure of this invention is a wiring structure of a semiconductor device formed, on a semiconductor element, with a barrier insulating film and a first porous interlayer insulating film containing pores, and having a wiring and a via plug formed by embedding a metal wiring material in a wiring trench and a via hole formed in the first porous interlayer insulating film, and is characterized in that a second porous interlayer insulating film is formed at least a portion of the first porous interlayer insulating film and pores contained in the second porous interlayer insulating film have a size greater than that of the pores contained in the first porous interlayer insulating film.

The above wiring structure is characterized in that the size of the pores contained in the second porous interlayer insulating film is 1 nm or less. Further, the above wiring structure is characterized in that constituent elements of the first porous interlayer insulating film are the same as those of the second porous interlayer insulating film. Further, the above wiring structure is characterized in that the first and second porous interlayer insulating films are each in the form of a silicon oxide film containing carbon and hydrogen.

The above wiring structure is characterized in that a ratio of the number of carbon atoms to the number of silicon atoms in the second porous interlayer insulating film is smaller than a ratio of the number of carbon atoms to the number of silicon atoms in the first porous interlayer insulating film and a ratio of the number of oxygen atoms to the number of silicon atoms in the second porous interlayer insulating film is greater than a ratio of the number of oxygen atoms to the number of silicon atoms in the first porous interlayer insulating film.

The above wiring structure is characterized in that the second porous interlayer insulating film is formed at a side wall, surrounding the metal wiring material, of the first porous interlayer insulating film and the second porous interlayer insulating film has a thickness of 5 nm or more.

The above wiring structure is characterized in that a third porous interlayer insulating film is formed in a surface layer of a via interlayer insulating film being the first porous interlayer insulating film surrounding a side surface of the via plug, in a surface layer of a wiring interlayer insulating film being the first porous interlayer insulating film surrounding a side surface of the wiring, or in each of both the surface layers. The above wiring structure is characterized in that the third porous interlayer insulating film formed in the surface layer of the via interlayer insulating film, in the surface layer of the wiring interlayer insulating film, or in each of both the surface layers is 5 nm or more and 30 nm or less.

The above wiring structure is characterized by comprising the third porous interlayer insulating film of 5 nm or more and 30 nm or less formed in the surface layer of the via interlayer insulating film, in the surface layer of the wiring interlayer insulating film, or in each of both the surface layers and the second porous interlayer insulating film of 5 nm or more formed at the side wall, surrounding the metal wiring material, of the first porous interlayer insulating film.

The above wiring structure is characterized in that pores contained in the third porous interlayer insulating film have a size greater than that of the pores contained in the first porous interlayer insulating film, and the size of the pores contained in the second porous interlayer insulating film is 1 nm or less and greater than that of the pores contained in the third porous interlayer insulating film.

The above wiring structure is characterized in that the wiring trench and the via hole each have a tapered shape with an opening diameter decreasing downward.

The above wiring structure is characterized in that a fourth porous interlayer insulating film is formed over an entire via interlayer insulating film being the first porous interlayer insulating film surrounding a side surface of the via plug, over an entire wiring interlayer insulating film being the first porous interlayer insulating film surrounding a side surface of the wiring, or over each of both the entire via and wiring interlayer insulating films, and pores contained in the fourth porous interlayer insulating film have a size greater than that of the pores contained in the first porous interlayer insulating film.

The above wiring structure is characterized in that the wiring interlayer insulating film being the first porous interlayer insulating film surrounding the side surface of the wiring is made of a material containing cyclic SiO bonds and a hydrocarbon is bonded to a side chain of the cyclic SiO bonds. Further, the above wiring structure is characterized in that the cyclic SiO bonds form a six-membered ring or an eight-membered ring.

A semiconductor device of this invention is characterized in that the above wiring structure forms a plural-layer structure and a transistor is mounted in the plural-layer wiring structure.

A semiconductor device manufacturing method of this invention is a method of manufacturing a semiconductor device having a transistor mounted in wiring of a plural-layer structure, and is characterized by comprising, in a manufacturing step of the semiconductor device formed, on a semiconductor element, with a barrier insulating film and a porous interlayer insulating film and having a wiring and a via plug formed by embedding a metal wiring material in a wiring trench and a via hole formed in the porous interlayer insulating film, a step of irradiating an electron beam or an ultraviolet ray onto at least a portion of the porous interlayer insulating film before forming an opening in the barrier insulating film.

The above semiconductor device manufacturing method is characterized by comprising a step of etching the porous interlayer insulating film to form an opening and then irradiating an electron beam or an ultraviolet ray onto a side wall of the opening.

The above semiconductor device manufacturing method is characterized by comprising a step of irradiating an electron beam or an ultraviolet ray after forming an interlayer insulating film (hereinafter, a via interlayer insulating film) surrounding a side surface of the via plug, after forming an interlayer insulating film (hereinafter, a wiring interlayer insulating film) surrounding a side surface of the wiring, or after both the film forming steps.

The above semiconductor device manufacturing method is characterized by comprising a first irradiation step of irradiating an electron beam or an ultraviolet ray after forming the via interlayer insulating film, after forming the wiring interlayer insulating film, or after both the film forming steps, and a second irradiation step of etching the wiring interlayer insulating film and the via interlayer insulating film to form an opening and then irradiating an electron beam or an ultraviolet ray onto a side wall of the opening.

The above semiconductor device manufacturing method is characterized in that an arrival energy of electrons in the step of irradiating the electron beam is 0.25 keV or more and 20 keV or less and a wavelength of ultraviolet light in the step of irradiating the ultraviolet ray is 150 to 275 nm.

The above semiconductor device manufacturing method is characterized in that a temperature of a substrate of the semiconductor device in the step of irradiating the electron beam or the ultraviolet ray is set to 200° C. to 450° C., and further, the above semiconductor device manufacturing method is characterized in that irradiation is performed by inclining and rotating a substrate of the semiconductor device in the step of irradiating the electron beam or the ultraviolet ray.

Further, the above semiconductor device manufacturing method is characterized in that an insulating film having a pore size smaller than that of a via interlayer insulating film being the porous interlayer insulating film surrounding a side surface of the via plug, or an insulating film in which a ratio of the number of carbon atoms to the number of silicon atoms is greater than that in the via interlayer insulating film is applied to at least a wiring interlayer insulating film being the porous interlayer insulating film surrounding a side surface of the wiring. The above wiring interlayer insulating film is characterized in that the pore size is 0.5 nm or less and the ratio of the number of carbon atoms to the number of silicon atoms is three or more. Further, the above semiconductor device manufacturing method is characterized in that the wiring interlayer insulating film is made of a material containing cyclic SiO bonds and a hydrocarbon is bonded to a side chain of the cyclic SiO bonds. The cyclic SiO bonds are characterized by forming a six-membered ring or an eight-membered ring.

Effect of the Invention

According to this invention, by forming a low-permittivity and high-strength porous modified layer at the interlayer insulating film opening side wall, it is possible to improve the mechanical strength and adhesion of the wiring structure. Further, according to this invention, since it is possible to effectively remove an etching gas or the like adsorbed on the opening side wall, there is no problem of corrosion of a metal wiring material or the like and thus the highly reliable wiring properties can be realized. Further, according to this invention, since the pore size of the porous modified layer is controlled to 1 nm or less, it is possible to effectively suppress diffusion of gas, chemical solution, metal, or the like. Therefore, since the resistance to dynamic load can be improved without degrading the performance of a semiconductor device, it is possible to realize higher performance and higher reliability of the semiconductor device.

BEST MODE FOR CARRYING OUT THE INVENTION

Figure 1:
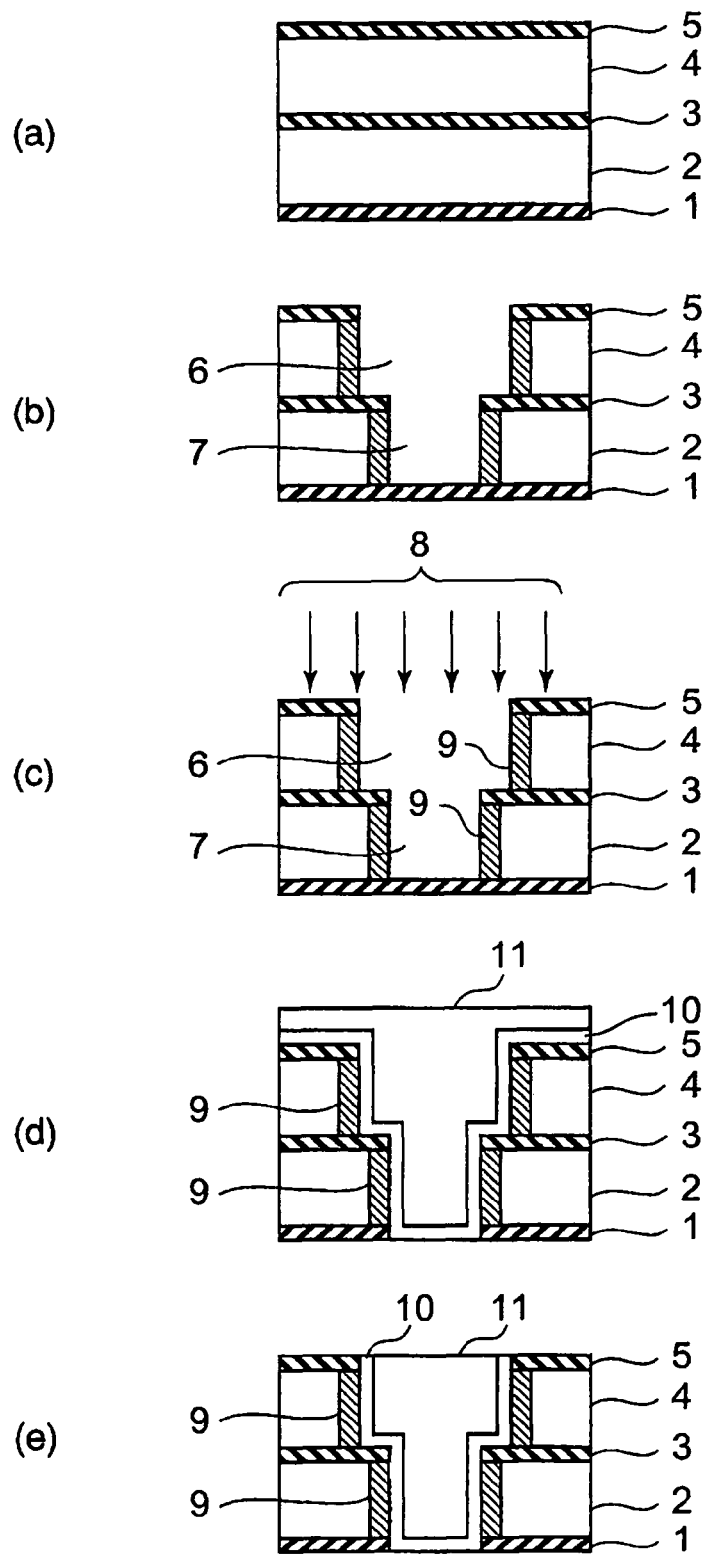
FIG. 1 is sectional structural views, relating to a semiconductor device manufacturing method, showing a first embodiment of this invention.

Now, embodiments of this invention will be described in detail with reference to the drawings. All the following structural views exemplarily show the embodiments of this invention and thus are not intended to define the sizes of the structures according to this invention on the basis of the ratios of components in the drawings.

First Embodiment

Referring to FIG. 1, there are shown sectional views relating to a semiconductor device manufacturing method as a first embodiment of this invention. As shown in FIG. 1, (a), at first, a via interlayer insulating film 2, an etching stopper 3, a wiring interlayer insulating film 4, and a hard mask 5 are deposited in the order named on a barrier insulating film 1 having a diffusion resistance to Cu. Herein, a material having a strong diffusion resistance to Cu is suitable for the barrier insulating film 1. For example, SiCN, SiN, SiC, SiOC, benzocyclobutene, or the like is preferable.

As each of the via interlayer insulating film 2 and the wiring interlayer insulating film 4, use is made of a silicon oxide film containing carbon and hydrogen (SiOCH) and having an average pore size of less than 1 nm. If the above conditions are satisfied, the via and wiring interlayer insulating films may be made of different kinds of materials. Two kinds of methods, i.e. a coating method and a CVD method, are popular as interlayer insulating film forming methods. The coating method has a feature in that volatile molecules to serve as nuclei of pores are caused to be contained in main monomers to be a framework of a film and spin coating is carried out, and then the volatile molecules are volatilized at the baking stage, so that the pores tend to be nonuniform through holes of normally 1 nm or more and thus the pore size control is difficult. On the other hand, uniform control of pores of less than 1 nm is enabled for an interlayer insulating film formed by the CVD method. Therefore, as the via and wiring interlayer insulating films, it is preferable to use insulating films formed by the CVD method. Herein, use was made of porous films having an average pore size of 0.6 nm.

As the etching stopper 3, use is made of a material having a high etching selectivity to the porous interlayer insulating films. For example, there is cited $SiO_2$, SiCN, SiN, SiC, SiOC, or the like. However, in order to reduce the effective permittivity of the wiring structure, it is preferable to select a material having as low a permittivity as possible. Further, as the hard mask 5, use is made of a material excellent in CMP (Chemical Mechanical Polishing) resistance (e.g. $SiO_2$, SiCN, SiN, SiC, SiOC, or the like is cited).

Then, as shown in FIG. 1, (b), a dual-damascene trench comprising a via hole 7 and a wiring trench 6 is formed using photoresists and reactive ion etching with a fluorine-based gas. Dual-damascene trench forming methods include a via-first process in which a via is first formed and then a photoresist is coated over the formed via to thereby form a wiring trench and a trench-first process in which a wiring trench is first formed and then a photoresist is coated over the formed wiring trench to thereby form a via hole. In this invention, the same effect is obtained using either of the methods.

Then, as shown in FIG. 1, (c), an electron beam or ultraviolet ray 8 is irradiated from above the substrate to form a porous modified layer 9 of 5 nm or more. The porous modified layer 9 has a feature in that the size of pores contained therein is 1 nm or less and greater than the size of pores contained in the interlayer insulating films before the irradiation of electron beam or ultraviolet ray.

Then, as shown in FIG. 1, (d), after etch-back of the barrier insulating film 1 at the bottom of the via hole, a laminated film of Ta/TaN is formed as a barrier metal 10 in the via hole 7 and the wiring trench 6 covered with the porous modified layer 9 and on the entire surface of the hard mask 5 by a PVD (Physical Vapor Deposition) method. The barrier metal 10 may be, other than the above, a metal such as Ti and its nitride or a laminate thereof. A method such as ALD (Atomic Layer Deposition) can be employed as a film forming method other than the PVD. After the formation of the barrier metal, a Cu seed layer is continuously deposited by a sputtering method without exposure to the atmosphere and then a Cu film 11 is deposited thereon by a plating method. In this manner, the metal wiring material is embedded in the via hole 7 so that a via plug is formed, and the metal wiring material is embedded in the wiring trench 6 so that a wiring is formed.

Then, as shown in FIG. 1, (e), the excess portions, deposited on the hard mask 5, of the barrier metal and the Cu film are removed and flattened by a CMP (Chemical Mechanical Polishing) process (FIG. 1, (d)). Depending on the necessity, a Cu alloy containing a different kind of metal such as Ti, Al, Sn, or Ag may be used as the Cu film.

The via interlayer insulating film 2 and the wiring interlayer insulating film 3 in this embodiment correspond to a first porous interlayer insulating film of this invention and the porous modified layer 9 in this embodiment corresponds to a second porous interlayer insulating film of this invention. Since the porous modified layer 9 is formed by irradiating the ultraviolet ray or the electron beam onto the via interlayer insulating film 2 and the wiring interlayer insulating film 3, constituent elements of the via interlayer insulating film 2 and the porous modified layer 9 and of the wiring interlayer insulating film 4 and the porous modified layer 9 are all the same. These interlayer insulating films are formed on a semiconductor element. The terms upper, lower, above, and so on in this invention represent upper, lower, and so on in the manufacturing state as shown in FIG. 1.

Figure 2:
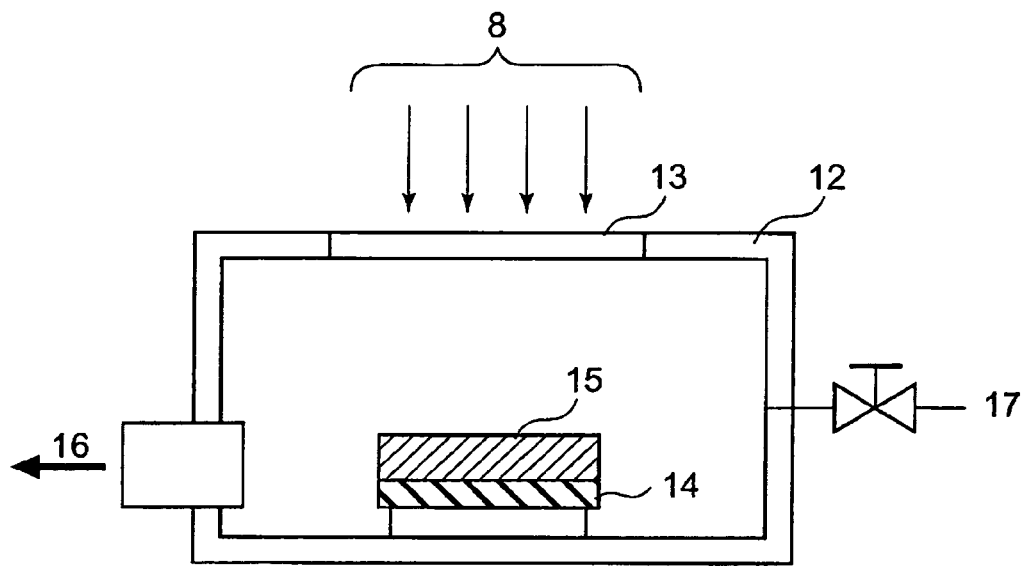
FIG. 2 is a schematic view of an electron-beam or ultraviolet-ray irradiation apparatus.

Next, on the basis of basic experimental data, a description will be given of a method of forming a porous modified layer by the irradiation of electron beam or ultraviolet ray being a feature of this invention, and its effects and mechanism. FIG. 2 is a schematic view of an electron-beam or ultraviolet-ray irradiation apparatus 12. An electron beam 8 or an ultraviolet ray 8 is irradiated onto an interlayer insulating film, formed on a semiconductor element, through an irradiation window 13 from an electron-beam source or an ultraviolet-ray source disposed above a sample 15. A semiconductor substrate can be heated by a heater stage 14. The inside of the apparatus is evacuated by a vacuum pump 16. An inert gas or the like can be introduced into the apparatus from a gas inlet 17. It is possible to properly adjust electron-beam or ultraviolet-ray irradiation energy, irradiation amount, and irradiation time.

Using the above apparatus, an electron beam or an ultraviolet ray is irradiated onto the side walls of the openings, i.e. the via hole and the wiring trench, in FIG. 1, (c), thereby forming a porous modified layer of 5 nm or more.

Features of the porous modified layer formed at the opening side walls are as follows. First, the mechanical strength of the porous modified layer is high. Second, the adhesion between the porous modified layer and an adjacent film is high. Third, control is performed such that, in the porous modified layer, the ratio of the number of carbon atoms to the number of silicon atoms decreases and the ratio of the number of oxygen atoms to the number of silicon atoms increases. Fourth, control is performed such that the average pore size of the porous modified layer is 1 nm or less and greater than the average pore size of the interlayer insulating films. Fifth, the etching gas adsorbed in the vicinity of the side walls of the via hole and the wiring trench is effectively removed.

Hereinbelow, the effects of this invention due to the introduction of the porous modified layer will be described in detail on the basis of the basic experimental results supporting the foregoing features.

Figure 3:
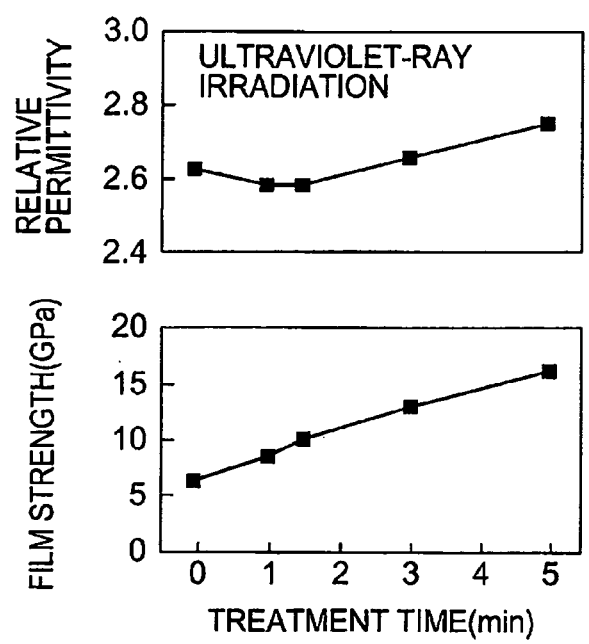
FIG. 3 is a graph showing the ultraviolet-ray irradiation time dependence of relative permittivity and film strength of a porous insulating film.

With respect to the first feature, FIG. 3 shows the irradiation time dependence of relative permittivity and film strength of a porous insulating film when an ultraviolet ray was irradiated. Herein, use was made of a sample with an SiOCH film of 200 nm containing carbon and hydrogen formed by the foregoing CVD method. The average pore size was 0.6 nm. The permittivity showed a tendency of being constant with almost no dependence when the irradiation time of ultraviolet ray was about three minutes, while gradually increasing with an irradiation time of three minutes or more. On the other hand, the film strength largely increased with the irradiation time.

Figure 4:
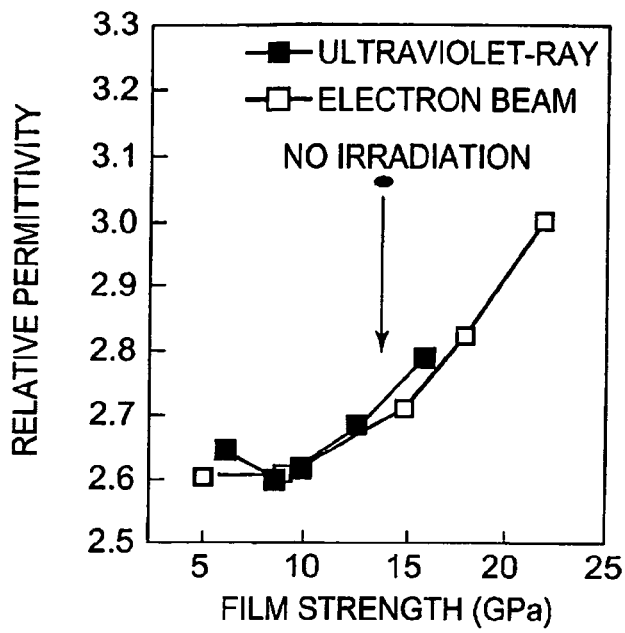
FIG. 4 is a graph showing the relationship between relative permittivity and film strength after the electron-beam irradiation and that after the ultraviolet-ray irradiation.

FIG. 4 is a graph plotting the relationship between relative permittivity and film strength based on the results of FIG. 3. FIG. 4 also shows the results by the electron-beam irradiation. It is shown that the film strength dependence of permittivity by the ultraviolet-ray irradiation and that by the electron-beam irradiation well correspond to each other and the same effect is obtained. A black circle (●) in the figure represents an insulating film with a composition of SiOCH and a relative permittivity of 3.1 that has not been subjected to the electron-beam or ultraviolet-ray irradiation. In comparison between these insulating films at the same film strength (13 GPa), the relative permittivity of the porous insulating film irradiated with the electron beam or the ultraviolet ray is about 2.7 and thus it becomes possible to achieve a large reduction in permittivity. Therefore, the electron-beam or ultraviolet-ray irradiation can largely improve the mechanical strength of the porous insulating film while maintaining the low permittivity.

Figure 5:
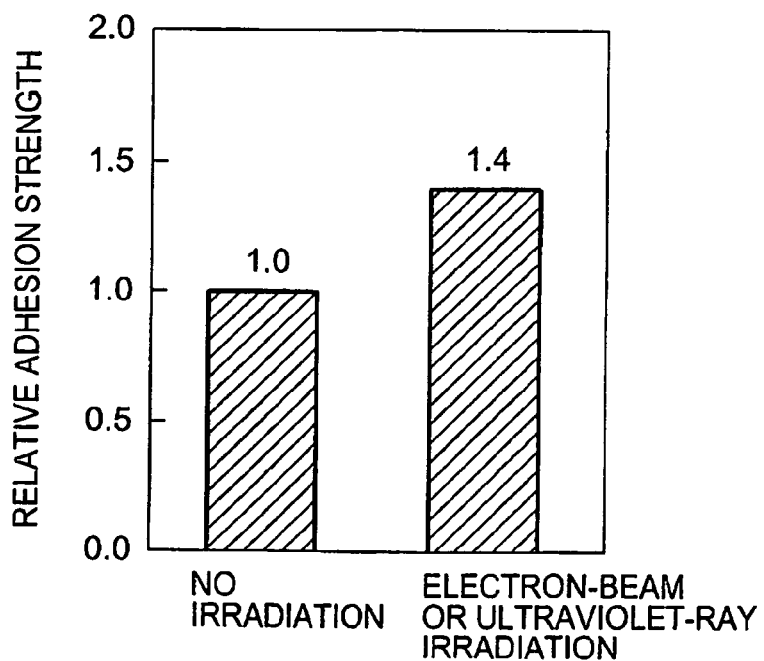
FIG. 5 is a graph showing the adhesion evaluation results after the electron-beam irradiation or the ultraviolet-ray irradiation.
Figure 6:
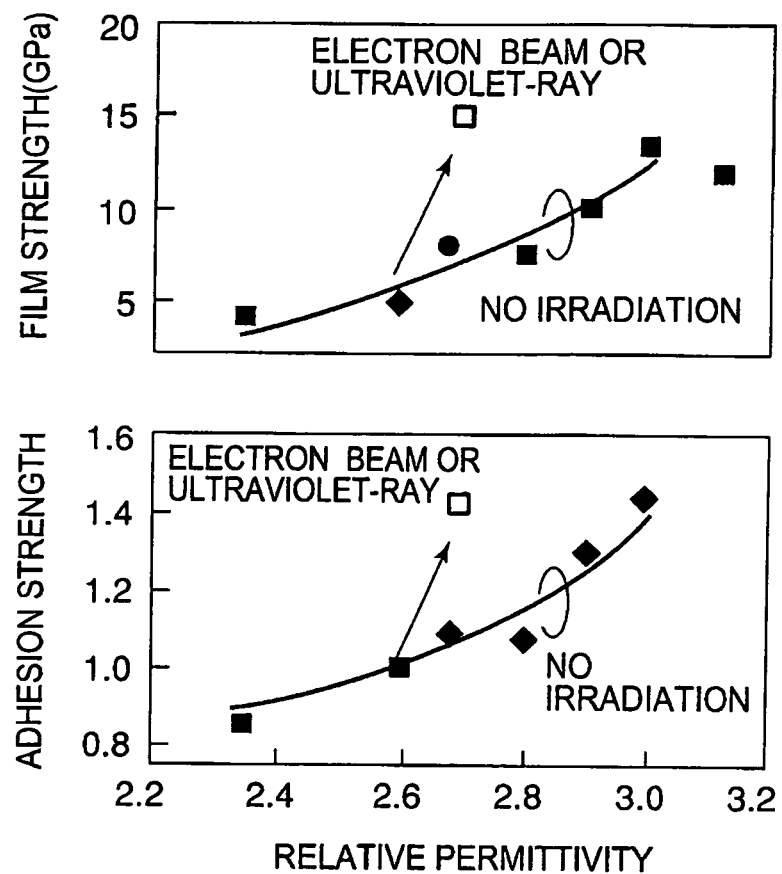
FIG. 6 is a graph showing the relative permittivity dependence of film strength and adhesion strength after the electron-beam irradiation or the ultraviolet-ray irradiation.

With respect to the second feature, FIG. 5 shows the results of evaluating the adhesion strength of a laminated structure (etching stopper/porous insulating film/barrier insulating film) due to the electron-beam or ultraviolet-ray irradiation. $SiO_2$ was used as the etching stopper and SiCN was used as the barrier insulating film. The upper-layer $SiO_2$ was formed after irradiating an electron beam or an ultraviolet ray onto the porous insulating film. The adhesion strength was evaluated by an m-ELT (modified Edge Lift-off Test). Stripped portions are all at the porous insulating film/barrier insulating film interface and therefore the adhesion of this interface is relatively low. However, the adhesion strength of the porous insulating film/barrier insulating film interface increased to about 1.5 times by the electron-beam or ultraviolet-ray irradiation. FIG. 6 shows the relative permittivity dependence of film strength and adhesion strength. A black circle (●) in the figure represents an insulating film with a composition of SiOCH by the CVD method that has not been subjected to the electron-beam or ultraviolet-ray irradiation. It was confirmed that the film strength and the adhesion were largely improved at the low permittivity by the electron-beam or ultraviolet-ray irradiation.

Figure 7:
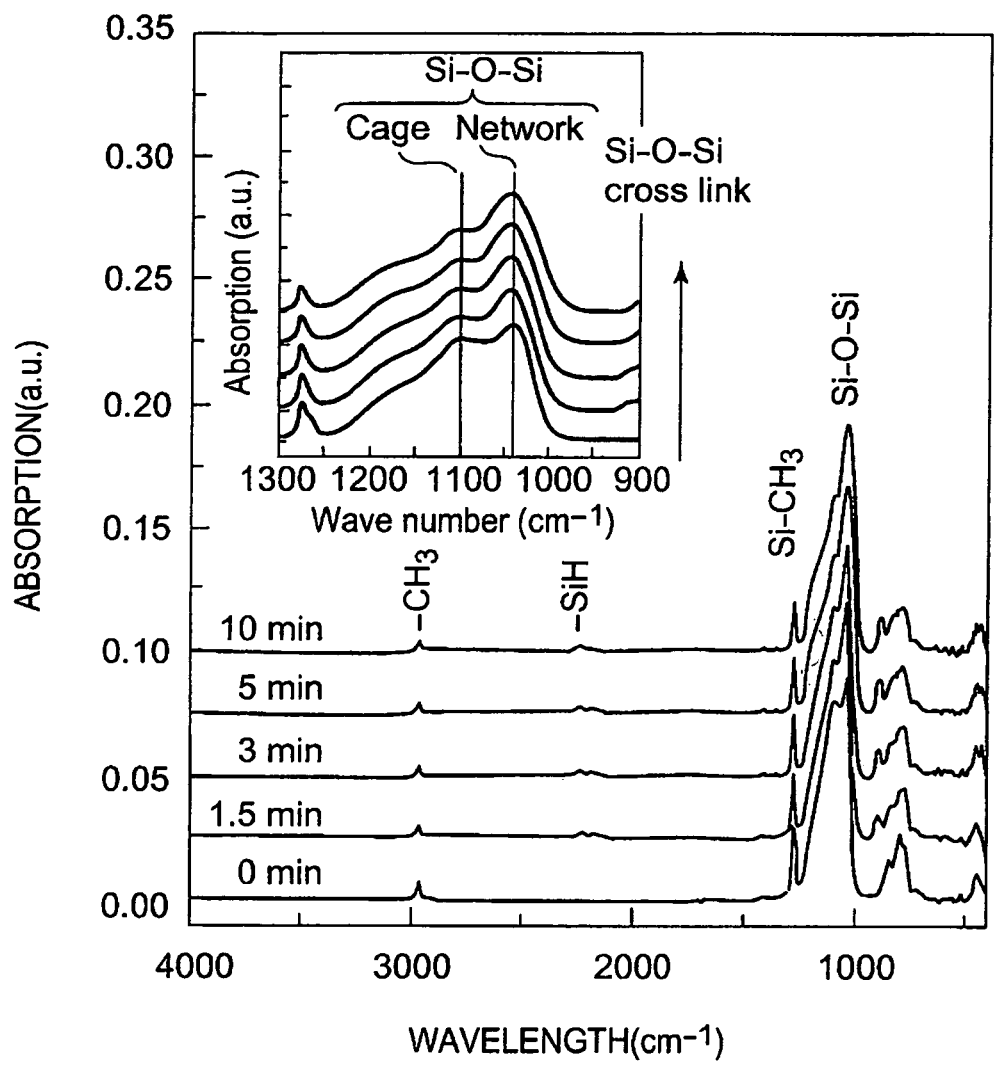
FIG. 7 is a graph showing the ultraviolet-ray irradiation time dependence of FTIR spectrum.

With respect to the third feature, FIG. 7 shows the ultraviolet-ray irradiation time dependence of film composition, using an FTIR (Fourier Transform Infrared). The spectra are illustrated so as to be shifted upward as the ultraviolet-ray irradiation time increases. In the FTIR spectrum before the irradiation, there are observed a Si—CH$_3$ peak (1270 cm$^{-1}$) at which carbon and hydrogen in the form of methyl groups (CH$_3$) are bonded to silicon atoms and a peak (1000-1200 cm$^{-1}$) attributed to SiO—Si bonds forming a main framework of the film. The film composition shows a tendency that as the ultraviolet-ray irradiation time increases, the Si—CH$_3$ peak decreases and a peak (2200 cm$^{-1}$) attributed to SiH bonds newly increases. That is, this means that the methyl groups are dissociated and desorbed due to the ultraviolet-ray irradiation energy and a part of the dissociated hydrogen atoms terminate silicon dangling bonds.

As shown in an inserted diagram in FIG. 7, two split peaks of SiO—Si change with the irradiation time from cage-type bonding to network-type SiO—Si. This change shows that isolated short-distance. SiO—Si bonds are crosslinked to form a strong long-distance network. These desorption of the methyl groups and formation of SiO—Si into the network were observed also in the case of the electron-beam irradiation. Further, as a result of evaluating the atomic composition in the porous modified layer after the irradiation by photoelectron spectroscopy (XPS), it showed a tendency after either irradiation that the ratio of the number of carbon atoms to the number of silicon atoms decreased and the ratio of the number of oxygen atoms to the number of silicon atoms increased as shown in Table 1. These atomic composition ratios can also be confirmed using, for example, a technique such as EDX (Energy Dispersive X-ray) or EELS (Electron Energy Loss Spectroscopy) mounted in a transmission electron microscope (TEM), thereby analyzing the chemical composition of the porous modified layer formed in the fine wiring structure.

TABLE 1

|  | O/Si | C/Si |
|---|---|---|
| Nontreated | 1.47 | 0.37 |
| After Ultraviolet-Ray Irradiation | 1.53 | 0.25 |
| After Electron-Beam Irradiation | 1.54 | 0.30 |

Figure 8:
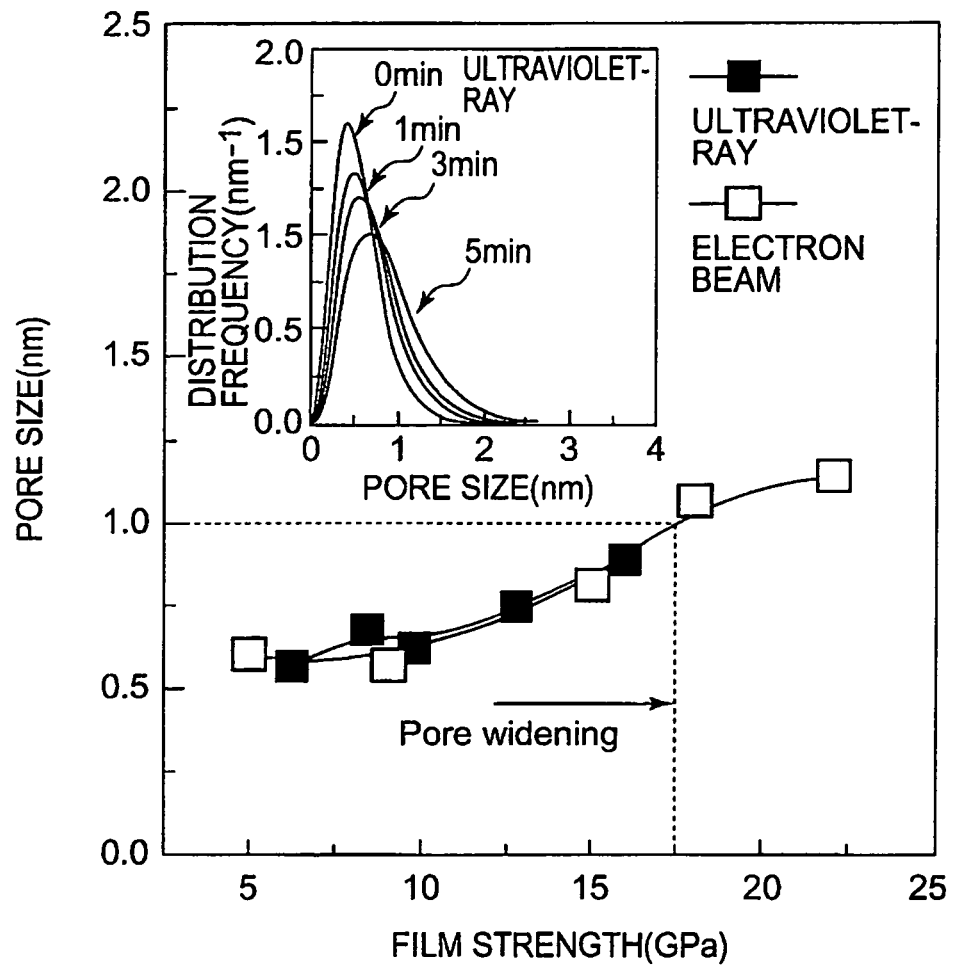
FIG. 8 is a graph showing the film strength dependence of average pore size by the electron-beam irradiation or the ultraviolet-ray irradiation.
Figure 9:
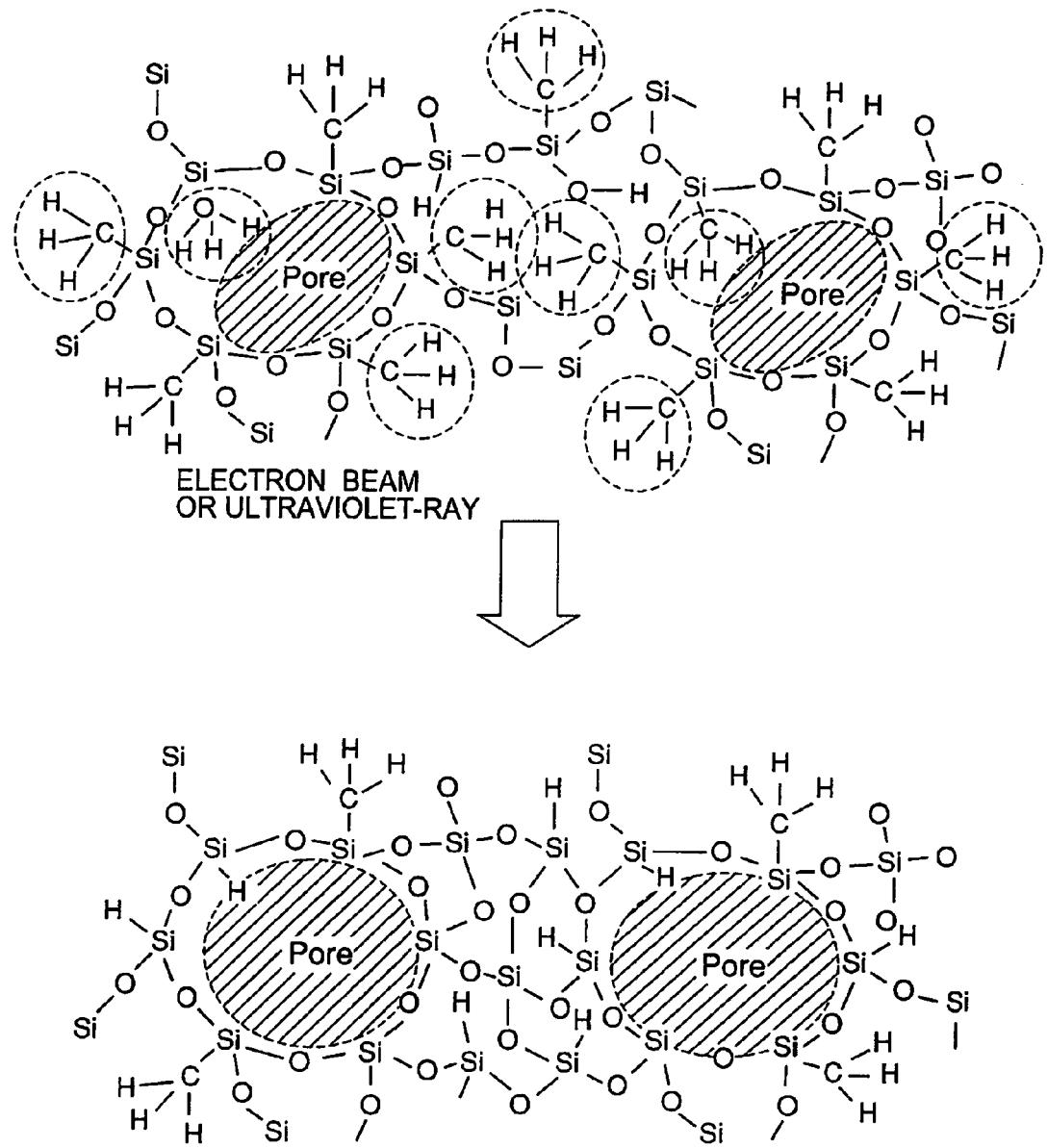
FIG. 9 is a schematic view showing a porous film strengthening mechanism.
Figure 10:
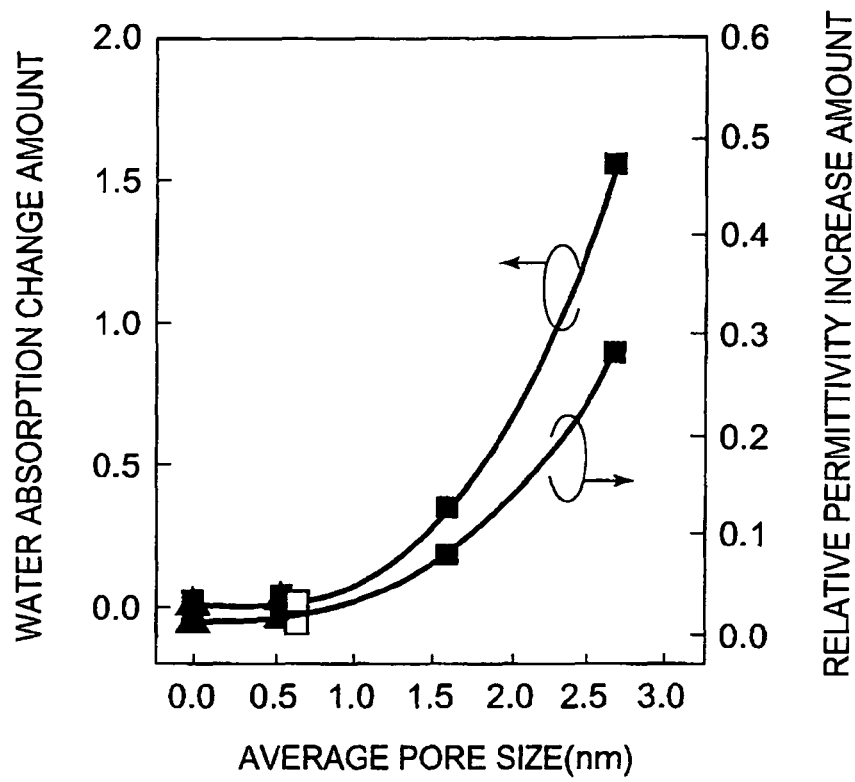
FIG. 10 is a graph showing the average pore size dependence of absorption amount of water diffusing in a porous insulating film and permittivity increase amount thereof.

With respect to the fourth feature, FIG. 8 shows the film strength dependence of average pore size after the electron-beam or ultraviolet-ray irradiation, using small-angle X-ray scattering. The average pore size described in this specification is a pore size when the distribution area becomes half in each of pore size distribution curves shown in an inserted diagram of FIG. 8. The average pore size showed a tendency of increasing as the film strength increased, after either irradiation. This increase in average pore size due to the electron-beam or ultraviolet-ray irradiation is caused by desorption of bulky methyl groups projecting into the pores as shown in FIG. 9. However, the increase in pore size causes degradation of the wiring properties because the pores serve as flow paths for water, gas, or the like. FIG. 10 shows the average pore size dependence of absorption amount of water in a porous insulating film and permittivity increase amount thereof, using thermal desorption spectroscopy (TDS). By controlling the average pore size to approximately 1 nm or less, it is possible to effectively suppress the water absorption amount and further to realize the stable low-permittivity properties.

Therefore, although the formation of the porous modified layer by the electron-beam or ultraviolet-ray irradiation acts in a direction to increase the pore size, by controlling the average size thereof to 1 nm or less, it is possible to largely suppress a rapid increase of water, chemical solution, or gas during the process and to realize high strength and high adhesion.

With respect to the fifth feature, although the fluorine-based gas being the etching gas is adsorbed in the vicinity of the side walls after the etching, it can be effectively removed in the course of forming the porous modified layer of 5 nm or more. As main causes of such a removal effect, there are cited the desorption assist effect by electrons or ultraviolet light and an increase in the number of desorption paths due to the increase in pore size. By the removal of the fluorine-based etching gas, it is possible to avoid the problem of corrosion due to reaction with the metal wiring material or the like.

Figure 11:
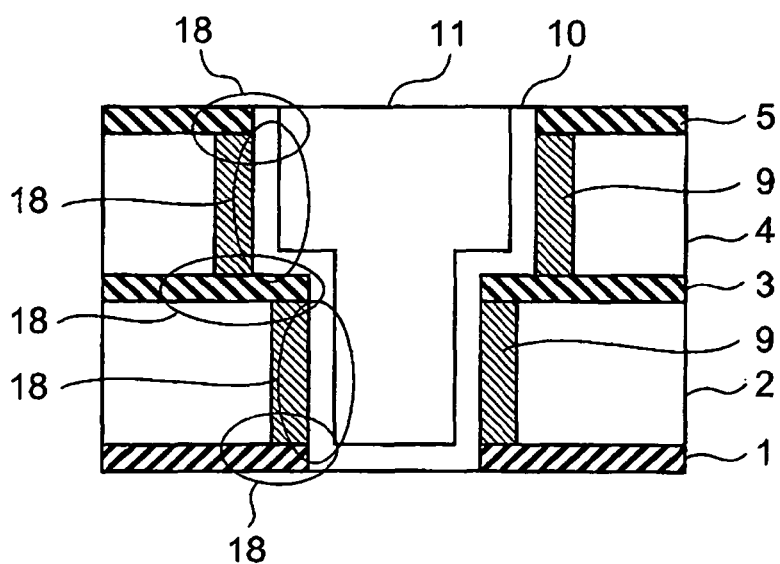
FIG. 11 is a sectional structural view showing the first embodiment of this invention.

As described above as to the five features, the formation of the porous modified layer in the interlayer insulating film openings by the electron-beam or ultraviolet-ray irradiation is such that, as also shown in FIG. 11, the modified layer 9 is formed, while maintaining its low permittivity, as a support so as to surround the wiring material 11 to strengthen it. Therefore, it exhibits a strong resistance to a mechanical impact such as wire bonding. The mechanical strength of the porous modified layer is subjected to limitation by the average pore size of 1 nm or less in terms of gas diffusion resistance. That is, as shown in FIG. 8, about 17.5 GPa becomes its upper limit. As compared with conventional, the wiring material is surrounded by the support having a 3.5 times greater mechanical strength.

Figure 12:
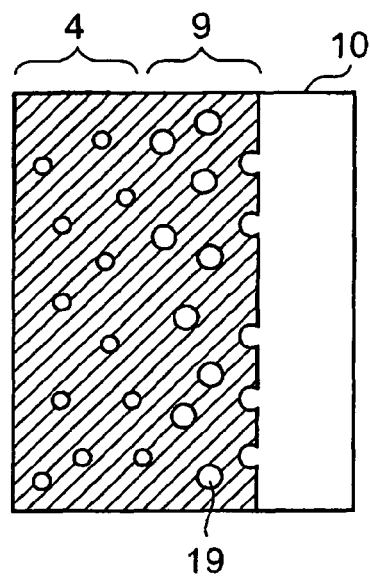
FIG. 12 is an enlarged view of the sectional structure showing the first embodiment of this invention.
Figure 31:
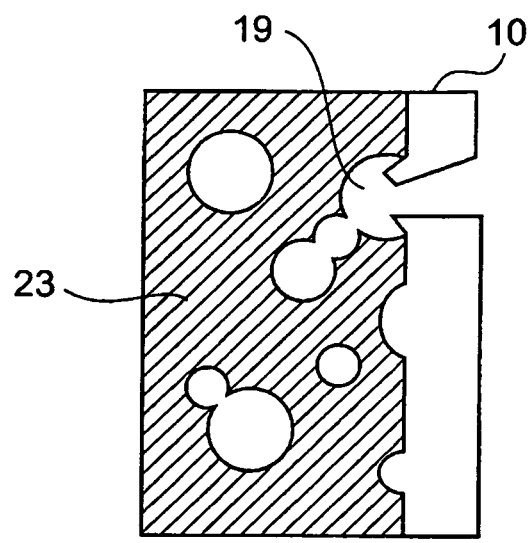
FIG. 31 is an enlarged view of a sectional wiring structure according to the prior art.

With respect to the adhesion, all regions, surrounded by ellipses 18 in FIG. 11, of the wiring structure are increased in adhesion. FIG. 12 shows an enlarged sectional view of the vicinity of the porous modified layer 9. With respect to the adhesion between the interlayer insulating film and the barrier metal, by forming the porous modified layer 9, fine concave/convex portions due to an increase in size of pores 19 are formed as compared with the case where the modified layer is not formed and, therefore, the adhesion to the barrier metal 10 can be improved by an anchoring effect as shown in FIG. 12. Further, in this invention, since the average pore size of the porous modified layer is set to 1 nm or less, there is no occurrence of the coating failure of the barrier metal as shown in the conventional example (FIG. 31). Stripped portions in the CMP process are edge portions of the hard mask and the wiring interlayer insulating film adjacent to the barrier metal. However, the adhesion of this interface is also largely improved by forming the porous modified layer, so that it is possible to ensure a sufficient CMP resistance when carrying out wiring on an experimental basis. Further, although, as described before, the interface between the interlayer insulating film and the barrier insulating film is the interface with the lowest adhesion in the length-direction laminated structure, it is possible to achieve an approximately 1.5 times greater strength (FIG. 5).

As described above, according to the effects of this invention, it is possible to achieve the increase in film strength and the increase in adhesion, suppress the diffusion phenomenon due to the pores, and avoid the problem of metal wiring material corrosion or the like while maintaining the low permittivity, thereby forming a highly reliable wiring structure, i.e. semiconductor device.

Figure 13:
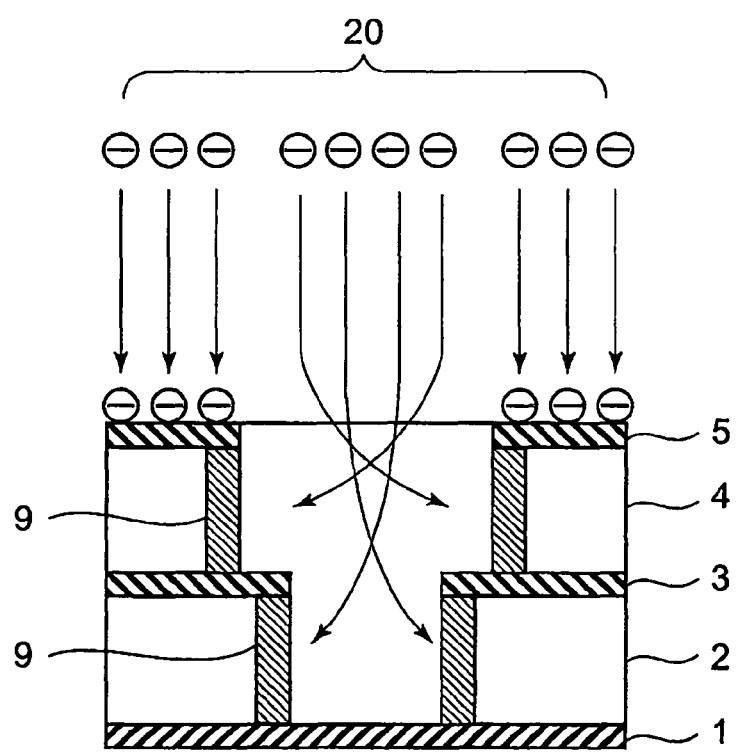
FIG. 13 is a sectional structural view (perpendicular opening shape) showing the first embodiment of this invention.
Figure 14:
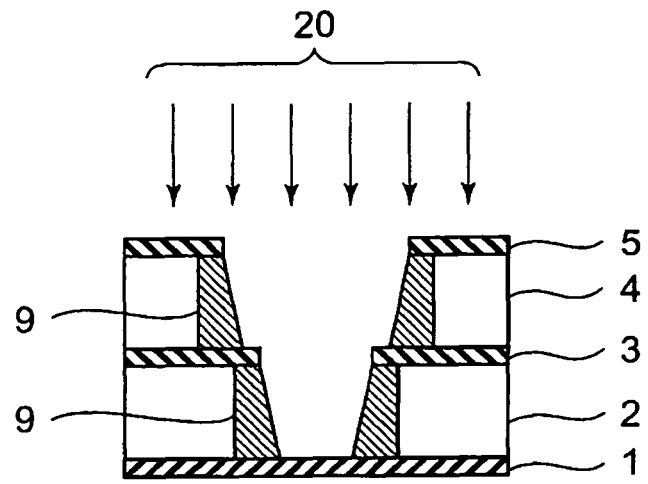
FIG. 14 is a sectional structural view (tapered shape) showing the first embodiment of this invention.
Figure 15:
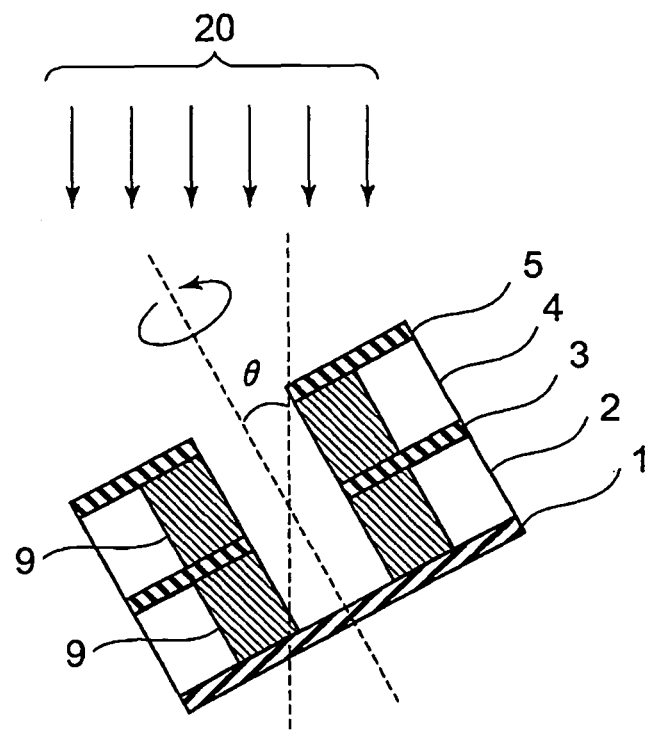
FIG. 15 is a sectional structural view (inclined rotation) showing the first embodiment of this invention.

Next, a description will be given of the optimum electron-beam or ultraviolet-ray irradiation conditions for obtaining the foregoing effects. In order to form the porous modified layer at the respective side walls of the fine and high-aspect-ratio wiring trench and via hole, it is necessary to effectively irradiate an electron beam or an ultraviolet ray onto the above side walls. The ultraviolet ray is divergent light and thus reaches even the opening side walls formed in a perpendicular shape and, therefore, the formation of the modified layer is easy. In the case of the electron-beam irradiation, the directivity of an electron beam is strong. However, as shown in FIG. 13, electrons 20 are charged up on the surface of the hard mask 15 being an insulating film. Therefore, the orbit of electrons incident in the vicinity of the opening is bent so that the electrons also reach the opening side walls, and consequently, it is possible to form a porous modified layer of about 8 nm. However, in order to further enhance the effect of irradiation onto the side walls, it is possible to form a tapered via hole and a tapered wiring trench as shown in FIG. 14. Further, as shown in FIG. 15, by inclining a substrate of a semiconductor device and irradiating an electron beam while rotating it, it is also possible to effectively form a porous modified layer at the side wall portions and control the formation. For example, in the case where the minimum width of a wiring trench and the width of a via hole are equal to each other, given that the height from the bottom of the via hole to the top of the trench is h and each width is w, it is possible to obtain a sufficient irradiation effect even at the bottom portion of the via hole by performing the irradiation at an incident angle θ satisfying tan θ>w/h. Although, herein, the case is shown in which the substrate of the semiconductor device is inclined, the electron-beam source itself may be inclined for irradiation. The electron-beam irradiation methods shown in FIGS. 14 and 15 may also be applied to the ultraviolet-ray irradiation.

As the electron-beam or ultraviolet-ray irradiation energy, it is necessary to apply an energy sufficient for causing the desorption of the methyl groups and the recombination of the SiO—Si bonds in the porous insulating film. The bonding energy of SiO changes depending on the kinds of peripheral bonding species and their bonding states, but is approximately 4.5 eV to 8.5 eV which is greater than the bonding energy of Si—CH$_3$. Therefore, by substantially adding an energy corresponding to the bonding energy of SiO, the porous modified layer can be formed. In the case of the ultraviolet, it is preferable to irradiate ultraviolet light having a wavelength of 150 to 275 nm corresponding to the bonding energy of SiO.

Figure 16:
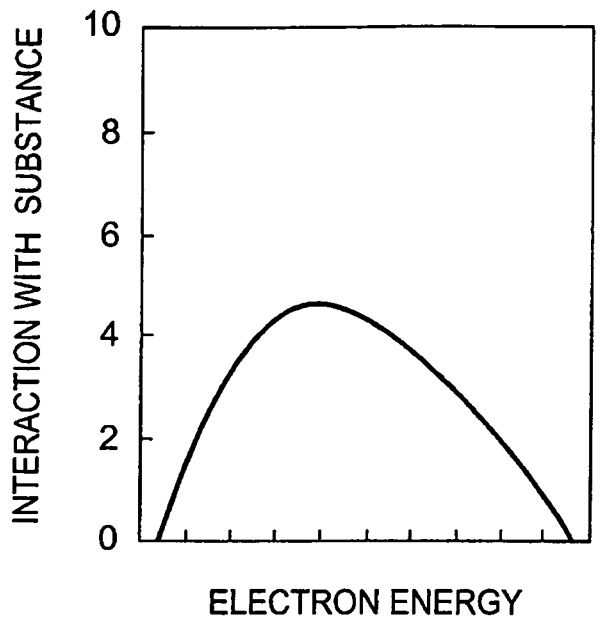
FIG. 16 is a graph showing the relationship between electron energy and interaction.

On the other hand, with respect to the electron-beam irradiation energy, it is normally a high energy of about several keV for ensuring the directivity of an electron beam to some degree and thus the interaction with a substance is different from that in the case of the light irradiation like the ultraviolet-ray irradiation. FIG. 16 shows the general relationship of interaction between electrons and a substance while changing the electron energy. Although the interaction is facilitated as the energy of electrons increases, the electrons do not interact with a substance but pass at a certain or greater energy. For example, it was experimentally confirmed that, in the case of a porous insulating film with a composition of SiOCH, a porous modified layer was not formed with the irradiation of an electron beam having an energy of 50 keV or more. Consequently, the upper limit of the electron energy is 50 keV.

Figure 17:
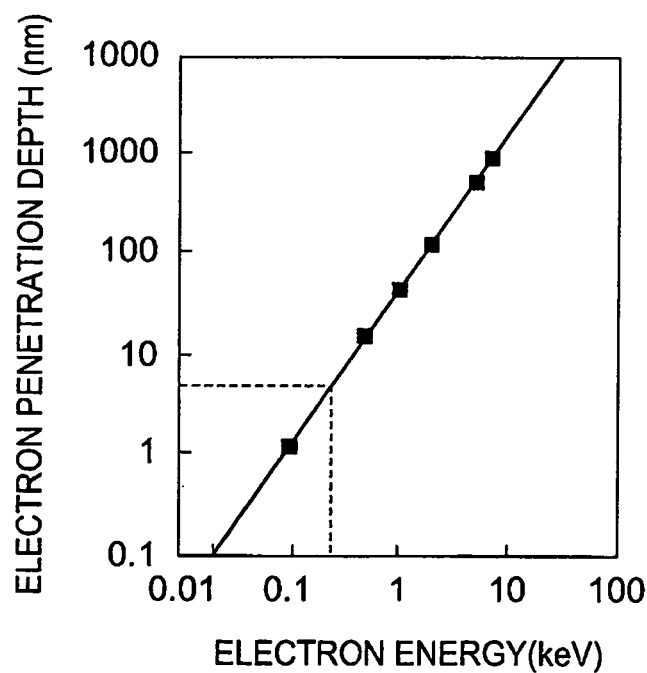
FIG. 17 is a graph showing the electron energy dependence of electron penetration depth.

From the results of the Monte Carlo simulation, as shown in FIG. 17, the penetration depth of electrons into the insulating film with the composition of SiOCH increases as the electron energy increases. In order to form a porous modified layer of 5 nm or more with which the effects are obtained in this invention, it is necessary to set the electron penetration length to at least 5 nm or more. That is, it is preferable that the lower limit of the electron energy be controlled at 0.25 keV. Accordingly, the electron energy upon reaching a substrate (respective insulating films to be modified) of a semiconductor device is suitably 0.25 keV or more and 50 keV or less. However, if the electron energy excessively increases, it becomes difficult that there occur changes in electron obit in the opening due to charge-up as shown in FIG. 13. Therefore, it is more preferable that the electron energy be set to 0.25 keV or more and 20 keV or less.

As also shown in FIG. 17, when an electron beam of 20 keV being the upper-limit energy is irradiated, electrons penetrate deep into the substrate. However, desorption of methyl groups is essential in the course of forming the porous modified layer. Therefore, the modified layer is selectively formed from the opening side walls where the methyl groups tend to be desorbed, i.e. the wiring trench and via hole side walls where the porous insulting films are exposed.

Also in the case of the ultraviolet-ray irradiation, the porous modified layer is formed from the opening side walls by the same mechanism. The thickness of the porous modified layer can be adjusted by properly controlling the dose, the electron acceleration voltage, the substrate temperature, and the treatment time in the case of the electron-beam irradiation. On the other hand, in the case of the ultraviolet-ray irradiation, it can be adjusted by properly controlling the wavelength within the foregoing range, the power density, the substrate temperature, and the treatment time.

With respect to the setting of the substrate temperature at the time of the electron-beam or ultraviolet-ray irradiation, it should be set to a high temperature for desorbing the dissociated methyl groups from the film. In terms of the treatment time, since the treatment is finished in a shorter time at a higher temperature, the throughput is improved. However, if the temperature becomes too high, there is a case where Cu in fine vias in the multilayer wiring structure is subjected to excessive thermal stress so as to be disconnected, and therefore, the upper limit of the temperature is limited to 450° C. or less. As described above, in terms of higher throughput and wiring reliability, the substrate temperature is preferably 200° C. to 450° C. The atmosphere at the time of the irradiation may be a vacuum, but, in order to reduce deposition of hydrocarbons or the like onto the inner wall of the apparatus due to desorbed gas from the substrate, it is preferable to introduce an inert gas such as Ar or He from the gas inlet.

Example 1

Next, using a specific example of a semiconductor device according to this embodiment, a description will be given of a film laminated structure provided in the semiconductor device. This invention is not limited at all by such an example.

As shown in FIG. 1, (a), at first, on SiCN of 30 nm as a barrier insulating film 1 having a diffusion resistance to Cu, a via interlayer insulating film 2 with a composition of SiOCH having an average pore size of 0.6 nm is formed to 150 nm by a CVD method and, thereon, SiO$_2$ is formed to 30 nm as an etching stopper 3. On the etching stopper 3, a wiring interlayer insulating film 4 with a composition of SiOCH having an average pore size of 0.6 nm is formed to 150 nm by the CVD method and SiO$_2$ is deposited to 30 nm as a hard mask 5 in order. Herein, the same material was used as the wiring interlayer insulating film 4 and the via interlayer insulating film 2.

Then, as shown in FIG. 1, (b), a dual-damascene trench comprising a via hole 7 and a trench 6 is formed by the use of a via-first process using photoresists and reactive ion etching with a fluorine-based gas CF4. The via diameter and the wiring width are each 100 nm.

Then, as shown in FIG. 1, (c), an electron beam or ultraviolet ray 8 is irradiated from above the substrate to form a porous modified layer 9 of 5 nm or more at the opening side walls. The conditions for the electron-beam irradiation were such that the electron energy was controlled at 7 keV and the treatment was performed for 5 minutes. On the other hand, the conditions for the ultraviolet-ray irradiation were such that the treatment was performed for 5 minutes using ultraviolet light having a central wavelength of 222 nm. In each irradiation, the treatment was performed with a substrate temperature of 350° C. in a He gas of 6650 Pa.

Then, as shown in FIG. 1, (d), after etch-back of the barrier insulating film SiCN at the bottom of the via hole 7, a laminated film of Ta/TaN of 10 nm and 5 nm, respectively, is formed as a barrier metal 10 in the via hole 7 and the wiring trench 6 covered with the porous modified layer 9 and on the entire surface of the hard mask 5 by a PVD (Physical Vapor Deposition) method. After the formation of the barrier metal, a Cu seed layer having a thickness of 50 nm is continuously deposited by a sputtering method without exposure to the atmosphere and then a Cu film 11 is deposited thereon by a plating method.

Then, as shown in FIG. 1, (e), the excess portions, deposited on the hard mask 5, of the barrier metal and the Cu film are removed and flattened by a CMP (Chemical Mechanical Polishing) process (FIG. 1, (d)).

In this example, the electron-beam irradiation process or the ultraviolet-ray irradiation process is performed before the etch-back process of the barrier insulating film SiCN. However, the irradiation process can be performed after the etch-back process of the barrier insulating film. However, in the case where the irradiation process is performed after the etch-back of the barrier insulating film, desorbed gas generated in the irradiation process adheres to the surface of a Cu film (not shown) under the barrier insulating film 1 formed with an opening by the etch-back, thereby modifying the Cu surface. Further, in the case where the irradiation process is performed after the etch-back of the barrier insulating film, the opening side walls of the via interlayer insulating film 2 and the wiring interlayer insulating film 4 are not strengthened before the etch-back of the barrier insulating film. Accordingly, these side walls tend to be subjected to side etching during the etch-back, so that the dimensional shift increases. Therefore, the electron-beam irradiation process or the ultraviolet-ray irradiation process is preferably performed before the etch-back process of the barrier insulating film SiCN.

As a result of observing a sectional structure after the formation of the wiring structure by the TEM, there was observed the modified layer 9 of about 8 nm to 15 nm at the via and trench side walls. By observing this modified layer 9 in more detail, there were observed pores having a diameter of 0.8 to 1.0 nm. Further, as a result of carrying out a chemical composition analysis of the porous modified layer 9 by the EELS, it was confirmed that the spectrum of oxygen to the spectrum of Si relatively increased and the spectrum of carbon to the spectrum of silicon relatively decreased, in the porous modified layer 9 as compared with the porous interlayer insulating films 2 and 4. Further, the above wiring structure was formed in six layers and mounted as an LSI device and, as a result, there was observed no failure such as film stripping during the process and the yield was improved by 30% or more as compared with conventional. Further, it was also confirmed that, with respect to the electrical properties, there was almost no change in effective permittivity and the stable wiring properties were exhibited.

Second Embodiment

Figure 18:
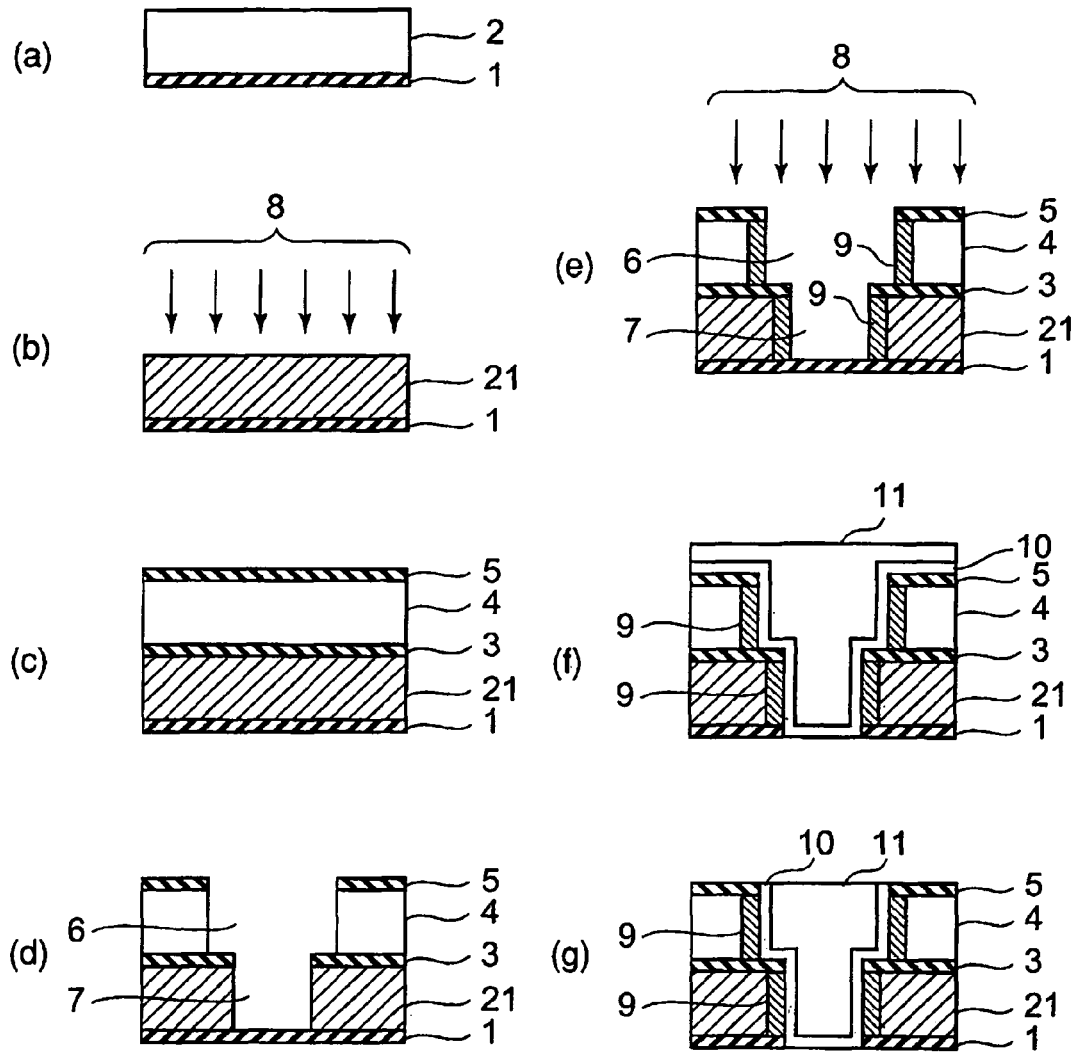
FIG. 18 is sectional structural views, relating to a semiconductor device manufacturing method, showing a second embodiment of this invention.

FIG. 18 is sectional structural views, relating to a semiconductor device manufacturing method, for explaining a second embodiment of this invention.

As shown in FIG. 18, (a), at first, a via interlayer insulating film 2 is formed on a barrier insulating film 1 having a diffusion resistance to Cu. A material having a strong diffusion resistance to Cu is suitable for the barrier insulating film 1. For example, SiCN, SiN, SiC, SiOC, benzocyclobutene, or the like is preferable. As the via interlayer insulating film 2, use is made of a silicon oxide film containing carbon and hydrogen (SiOCH) and having an average pore size of less than 1 nm. Herein, use was made of a porous interlayer insulating film with an average pore size of 0.6 nm formed by a CVD method.

After the formation of the via interlayer insulating film 2, as shown in FIG. 18, (b), an electron beam or ultraviolet ray 8 is irradiated from above the substrate to form a first porous modified layer 21 over the entire via interlayer insulating film 2. Pores contained in the first porous modified layer 21 have a feature in that the size thereof is less than 1 nm and greater than the size of pores originally contained in the porous interlayer insulating film before the irradiation of the electron beam or ultraviolet ray 8.

Then, as shown in FIG. 18, (c), an etching stopper 3, a wiring interlayer insulating film 4, and a hard mask 5 are deposited in the order named. As the etching stopper 3, use is made of a material having a high etching selectivity to the porous interlayer insulating film. For example, there is $SiO_2$, SiCN, SiN, SiC, SiOC, or the like. However, in order to reduce the effective permittivity of the wiring structure, it is preferable to select a material having as low a permittivity as possible. Herein, use was made of $SiO_2$ formed by the CVD method. As the wiring interlayer insulating film 4, use is made of a silicon oxide film containing carbon and hydrogen (SiOCH) and having an average pore size of less than 1 nm. If the above conditions are satisfied, the wiring interlayer insulating film 4 may be made of a material different from that of the via interlayer insulating film. As the hard mask 5, use is made of a material excellent in CMP (Chemical Mechanical Polishing) resistance (e.g. $SiO_2$, SiCN, SiN, SiC, SiOC, or the like is cited).

Then, as shown in FIG. 18, (d), a dual-damascene trench comprising a via hole 7 and a wiring trench 6 is formed using photoresists and reactive ion etching with a fluorine-based gas. Dual-damascene trench forming methods include a via-first process in which a via is first formed and then a photoresist is coated over the formed via to thereby form a wiring trench and a trench-first process in which a wiring trench is first formed and then a photoresist is coated over the formed wiring trench to thereby form a via hole. In this invention, the same effect is obtained using either of the methods.

Then, as shown in FIG. 18, (e), an electron beam or ultraviolet ray 8 is irradiated from above the substrate to form a second porous modified layer 9 of 5 nm or more at the opening side walls. The second porous modified layer 9 has a feature in that the average size of pores contained therein is 1 nm or less and greater than the average size of the pores contained in the first porous modified layer 21. In the forming process of the porous modified layer 9, it is possible to further enhance the irradiation effect by applying the tapered openings shown in FIG. 14 or using the inclined rotation method shown in FIG. 15.

Then, as shown in FIG. 18, (f), after etch-back of the barrier insulating film 1 at the bottom of the via hole 7, a laminated film of Ta/TaN is formed as a barrier metal 10 in the via hole 7 and the wiring trench 6 covered with the porous modified layer and on the entire surface of the hard mask 5 by a PVD (Physical Vapor Deposition) method. The barrier metal 10 may be, other than the above, a metal such as Ti and its nitride or a laminate thereof. A method such as ALD (Atomic Layer Deposition) can be employed as a film forming method other than the PVD. After the formation of the barrier metal 10, a Cu seed layer is continuously deposited by a sputtering method without exposure to the atmosphere and then a Cu film 11 is deposited thereon by a plating method.

Then, as shown in FIG. 18, (g), the excess portions, deposited on the hard mask 5, of the barrier metal and the Cu film are removed and flattened by a CMP (Chemical Mechanical Polishing) process. Depending on the necessity, a Cu alloy containing a different kind of metal such as Ti, Al, Sn, or Ag may be used as the Cu film.

The via interlayer insulating film 2 and the wiring interlayer insulating film 3 in this embodiment correspond to a first porous interlayer insulating film of this invention and the second porous modified layer 9 in this embodiment corresponds to a second porous interlayer insulating film of this invention. Further, the first porous modified layer 21 formed over the entire via interlayer insulating film 2 corresponds to a fourth porous modified layer of this invention.

Figure 19:
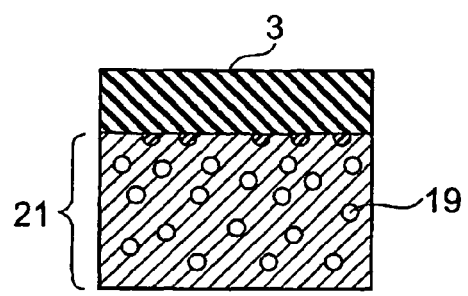
FIG. 19 is an enlarged view of the sectional structure showing the second embodiment of this invention.

This embodiment differs from the foregoing first embodiment in that the porous modified layer is formed not only at the via and trench opening side walls, but also over the entire via interlayer insulating film 21. Such electron-beam or ultraviolet-ray irradiation over the entire via interlayer insulating film 21 can further strengthen the adhesion between the barrier insulating film and the via interlayer insulating film. The region for ensuring the adhesion between the via interlayer insulating film 2 and the barrier insulating film 1 is limited to only a small portion at the bottom of the via interlayer insulating film 2 in the first embodiment as shown in FIG. 11, but it expands to all the interface between the via interlayer insulating film 2 and the barrier insulating film 1 in this embodiment. The interface between the via interlayer insulating film 2 and the barrier insulating film 1 is the weakest among the interfaces adjacent to the porous interlayer insulating films and thus is a main portion where stripping occurs due to excessive film stress in the multilayering of the wiring or the mounting process. Particularly, in an MPU element or the like for a supercomputer, higher dynamic load is generated at the interface between the via interlayer insulating film 2 and the barrier insulating film 1 due to the laminated wiring of ten layers or more and an increase in chip size. By applying this embodiment, it becomes possible to provide a multilayer wiring structure with sufficient reliability even for such a high-end device. Further, with respect to the interface with the etching stopper formed on the via interlayer insulating film 21 in the form of the porous modified layer, the average size of pores 19 increases by forming the porous modified layer 21 as shown in FIG. 19. Therefore, as compared with the case where the modified layer 21 is not formed, fine concave/convex portions are formed on the porous interlayer insulating film 21. Consequently, the adhesion between the etching stopper 3 and the via interlayer insulating film (porous modified layer) 21 can also be improved by the anchoring effect.

Figure 20:
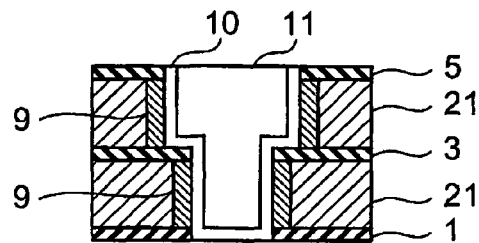
FIG. 20 is a sectional structural view showing the second embodiment of this invention.

Further, since the adhesion between the hard mask 5 and the wiring interlayer insulating film 4 is increased by the porous modified layer 9 formed at the side walls as described in the first embodiment, sufficient CMP resistance can also be ensured. As described above, the porous modified layer 9, 21 may be formed in part of or the whole of the interlayer insulating film depending on the kind and use of a device and, for example, as shown in FIG. 20, a porous modified layer 21 may be formed over the entire wiring interlayer insulating film 4 in addition to the via interlayer insulating film 2.

Third Embodiment

Figure 21:
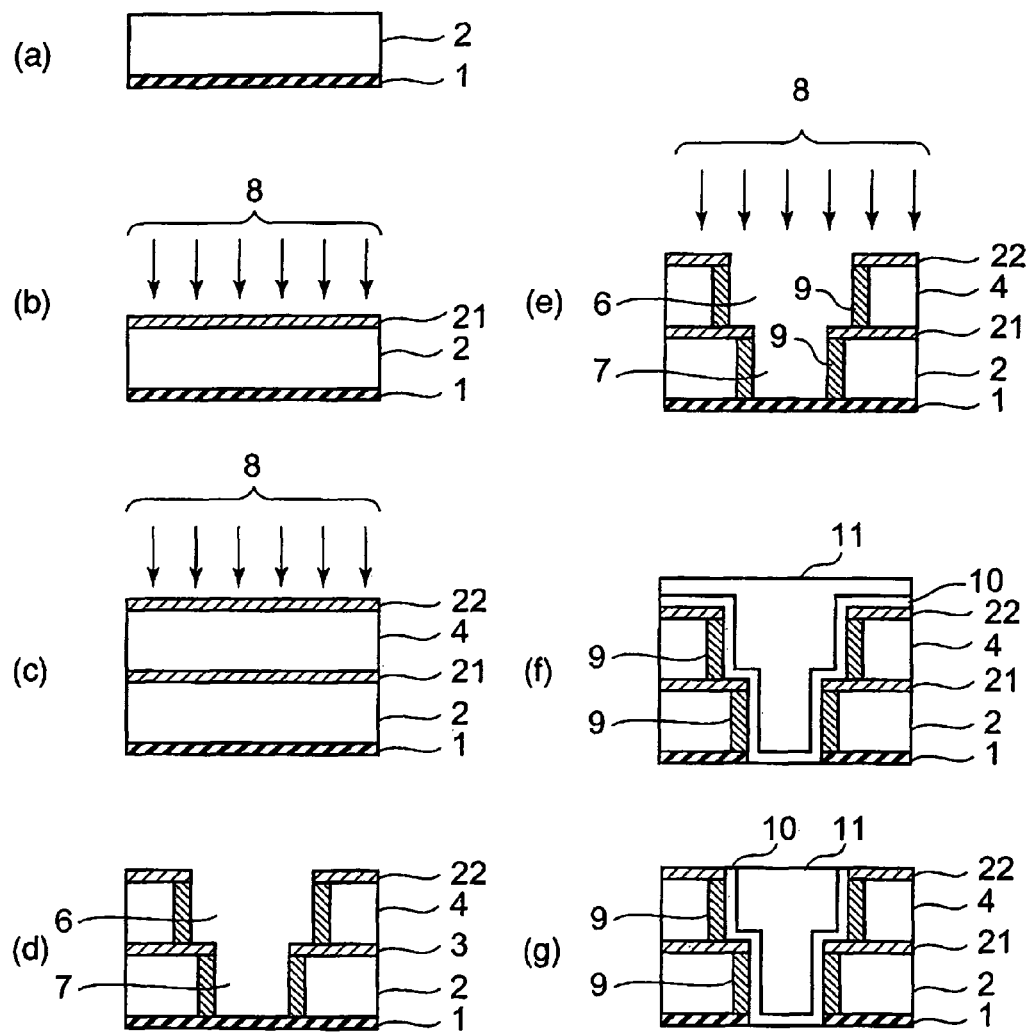
FIG. 21 is sectional structural views, relating to a semiconductor device manufacturing method, showing a third embodiment of this invention.

FIG. 21 is sectional structural views, relating to a semiconductor device manufacturing method, for explaining a third embodiment of this invention.

As shown in FIG. 21, (a), at first, a via interlayer insulating film 2 is formed on a barrier insulating film 1 having a diffusion resistance to Cu. A material having a strong diffusion resistance to Cu is suitable for the barrier insulating film 1. For example, SiCN, SiN, SiC, SiOC, benzocyclobutene, or the like is preferable. As the via interlayer insulating film 2, use is made of a silicon oxide film containing carbon and hydrogen (SiOCH) and having an average pore size of less than 1 nm. Herein, use was made of a porous interlayer insulating film with an average pore size of 0.6 nm formed by a CVD method.

After the formation of the via interlayer insulating film 2, as shown in FIG. 21, (b), an electron beam or ultraviolet ray 8 is irradiated from above the substrate to form a first porous modified layer 21 at the surface of the via interlayer insulating film 2. The first porous modified layer 21 has a feature in that the thickness thereof is 5 nm or more and 30 nm or less and the size of pores contained therein is less than 1 nm and greater than the size of pores originally contained in the porous interlayer insulating film 2.

Then, as shown in FIG. 21, (c), a wiring interlayer insulating film 4 is deposited. The wiring interlayer insulating film 4 is a porous insulating film with a composition of SiOCH having an average pore size of less than 1 nm and formed by the CVD method. If the above conditions are satisfied, the wiring interlayer insulating film 4 may be made of a material different from that of the via interlayer insulating film 2. Then, an electron beam or ultraviolet ray 8 is irradiated from above the wiring interlayer insulating film 4 to form a second porous modified layer 22 at the surface of the wiring interlayer insulating film 4. The second porous modified layer 22 has a feature in that, like the first porous modified layer 21, the thickness thereof is 5 nm or more and 30 nm or less and the size of pores contained therein is less than 1 nm and greater than the size of pores originally contained in the porous interlayer insulating film.

Then, as shown in FIG. 21, (d), a dual-damascene trench comprising a via hole 7 and a wiring trench 6 is formed using photoresists and reactive ion etching with a fluorine-based gas. Dual-damascene trench forming methods include a via-first process in which a via is first formed and then a photoresist is coated over the formed via to thereby form a wiring trench and a trench-first process in which a wiring trench is first formed and then a photoresist is coated over the formed wiring trench to thereby form a via hole. In this invention, the same effect is obtained using either of the methods.

Then, as shown in FIG. 21, (e), an electron beam or ultraviolet ray 8 is irradiated from above the substrate to form a third porous modified layer 9 of 5 nm or more at the opening side walls of the via hole 7 and the wiring trench 6. The third porous modified layer 9 has a feature in that the average size of pores contained therein is 1 nm or less and greater than the average size of the pores contained in the first and second porous modified layers. In the forming processes of the first, second, and third porous modified layers, it is possible to further enhance the irradiation effect by applying the tapered openings shown in FIG. 14 or using the inclined rotation method shown in FIG. 15.

Then, as shown in FIG. 21, (f), after etch-back of the barrier insulating film 10 at the bottom of the via hole 7, a laminated film of Ta/TaN is formed as a barrier metal 10, by a PVD (Physical Vapor Deposition) method, in the via hole 7 and the wiring trench 6 covered with the porous modified layer and on the entire surface of the wiring interlayer insulating film 4 formed with the second porous modified layer 22. The barrier metal 10 may be, other than the above, a metal such as Ti and its nitride or a laminate thereof. A method such as ALD (Atomic Layer Deposition) can be employed as a film forming method other than the PVD. After the formation of the barrier metal 10, a Cu seed layer is continuously deposited by a sputtering method without exposure to the atmosphere and then a Cu film 11 is deposited thereon by a plating method.

Then, as shown in FIG. 21, (g), the excess portions, deposited on the wiring interlayer insulating film 4 formed with the second porous modified layer 22, of the barrier metal and the Cu film are removed and flattened by a CMP (Chemical Mechanical Polishing) process. Depending on the necessity, a Cu alloy containing a different kind of metal such as Ti, Al, Sn, or Ag may be used as the Cu film.

The via interlayer insulating film 2 and the wiring interlayer insulating film 3 in this embodiment correspond to a first porous interlayer insulating film of this invention and the third porous modified layer 9 in this embodiment corresponds to a second porous interlayer insulating film of this invention. Further, the first porous modified layer 21 formed at the surface of the via interlayer insulating film 2 and the second porous modified layer 22 formed at the surface of the wiring interlayer insulating film 4 correspond to a third porous modified layer of this invention.

With respect to the formation of the first and second porous modified layers in this embodiment, as also described in the first embodiment, a porous modified layer with a desired thickness can be formed by controlling the electron energy at 0.25 keV to 20 keV and properly optimizing the dose, the substrate temperature, and the treatment time in the case of the electron-beam irradiation. On the other hand, in the case of the ultraviolet-ray irradiation, a porous modified layer with a desired thickness can be formed by properly optimizing the wavelength, the power density, the treatment time, and the substrate temperature.

This embodiment differs from the foregoing first embodiment in that the etching stopper 3 and the hard mask 5 are replaced by the porous modified layers. As the etching stopper 3 and the hard mask 5, a material capable of ensuring the etching selectivity to a porous insulating film of $SiO_2$, SiCN, SiN, or the like and a high-strength material having CMP resistance are suitable, respectively. However, these materials each have a high permittivity and thus increase the effective permittivity of the entire wiring structure. Specifically, the permittivity of $SiO_2$ is 4.2, that of SiCN is 4.9, and that of SiN is about 7.5. For example, in the case where the porous modified layers 21 and 22 each having a relative permittivity of 2.7 (average pore size 0.8 nm, film strength 15 GPa) are formed to 30 nm as an etching stopper and a hard mask, respectively, it is possible to reduce the effective permittivity by about 11% as compared with the case where $SiO_2$ is used as an etching stopper and a hard mask.

As described above, according to this embodiment, by replacing conventionally used high-permittivity etching stopper and hard mask with low-permittivity, high-strength, high-stability porous modified layers, it is possible to largely reduce the parasitic capacitance in the multilayer wiring. Therefore, by applying the multilayer wiring according to this embodiment to a semiconductor device requiring low power such as a portable telephone or a mobile device having a small number of wiring layers and a small chip size, it is possible to achieve both high reliability and high performance.

Figure 22:
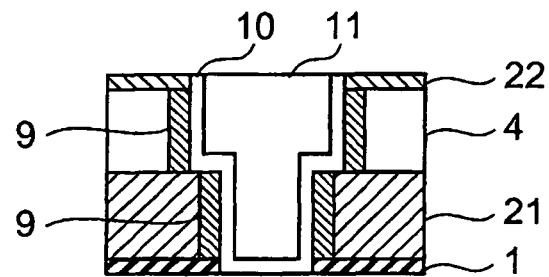
FIG. 22 is a sectional structural view showing the third embodiment of this invention.
Figure 23:
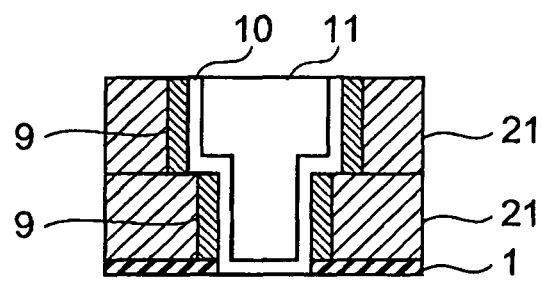
FIG. 23 is a sectional structural view showing the third embodiment of this invention.

Further, as shown in FIGS. 22 and 23, this embodiment can be combined with the second embodiment. FIG. 22 shows an example in which the entire via interlayer insulating film 2 is irradiated with an ultraviolet ray or an electron beam so as to be formed into a porous modified layer 21 and an ultraviolet ray or an electron beam is irradiated onto the upper portion (surface) of a wiring interlayer insulating film 4 to form a porous modified layer 22. FIG. 23 shows an example in which the entire via interlayer insulating film 2 is irradiated with an ultraviolet ray or an electron beam so as to be formed into a porous modified layer 21 and the entire wiring interlayer insulating film 4 is also irradiated with an ultraviolet ray or an electron beam so as to be formed into a porous modified layer 21.

Fourth Embodiment

Figure 24:
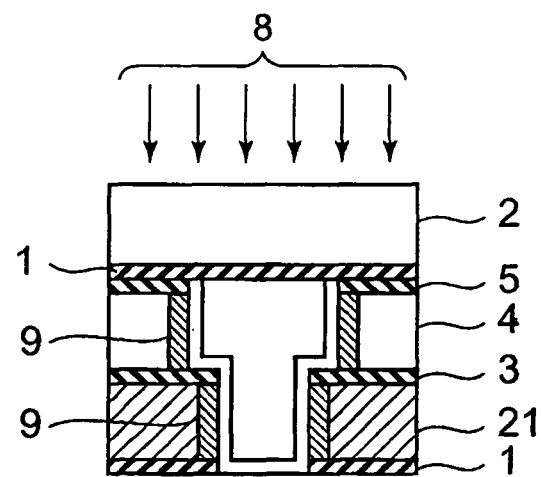
FIG. 24 is a sectional structural view showing a fourth embodiment of this invention.

In the first to third embodiments, the dual-damascene process having a pair of a via and a wiring portion has been described. However, in the actual multilayer wiring structure, when an electron beam or an ultraviolet ray is irradiated, the wiring structure is also formed in lower layers. Therefore, if electron or ultraviolet depth control is insufficient at the time of the electron-beam or ultraviolet-ray irradiation, excessive cure (overcure) is applied to a lower-layer interlayer insulating film. Particularly, in the case where an electron beam or an ultraviolet ray is irradiated over the entire via interlayer insulating film to improve the adhesion between the via interlayer insulating film 2 and the barrier insulating film 1 (FIGS. 18, 22, 23), there is a case where the influence of overcure is exerted on a wiring interlayer insulating film 4 formed in advance as shown in FIG. 24. As described before, the penetration length of an electron beam or an ultraviolet ray into an interlayer insulating film can be controlled by properly adjusting the irradiation conditions. However, when the interlayer insulating film is reduced in thickness following the miniaturization or the uniformity of the interlayer insulating film in the wafer plane is degraded, the control of the penetration length becomes difficult and thus the overcure to the lower layer arises as a problem. This embodiment is a technique for reducing the influence of the overcure.

In the first to third embodiments, the insulating films with the composition of SiOCH having the pore size of 0.6 nm are mainly used as the via and wiring interlayer insulating films. However, by applying two kinds of insulating films having different sensitivities to cure to via and wiring interlayer insulating films, it is possible to avoid the influence of overcure.

TABLE 2

| Low-k Film | Chemical Composition | | | | k-value | Pore size (nm) |
|---|---|---|---|---|---|---|
| | Si | O | C | H | | |
| A (Via Interlayer Insulating Film) | 1 | 1.5 | 0.4 | 1.9 | 2.60 | 0.6 |

TABLE 2-continued

| Low-k Film | Chemical Composition | | | | k-value | Pore size (nm) |
|---|---|---|---|---|---|---|
| | Si | O | C | H | | |
| B (Wiring Interlayer Insulating Film) | 1 | 1.1 | 3.2 | 6.2 | 2.45 | 0.4 |

Table 2 shows the film properties of a film A (via interlayer insulating film) and a film B (wiring interlayer insulating film) which are the most effective among insulating films examined in this invention. The film A is the insulating film shown in the first to third embodiments. The film B has a feature in that, as compared with the film A, the content of carbon is about five times higher and the pore size is smaller. It is also a feature that SiO bonds are randomly arranged in the film A, while, SiO bonds form six-membered rings and are bonded through many hydrocarbons in the film B.

Figure 25:
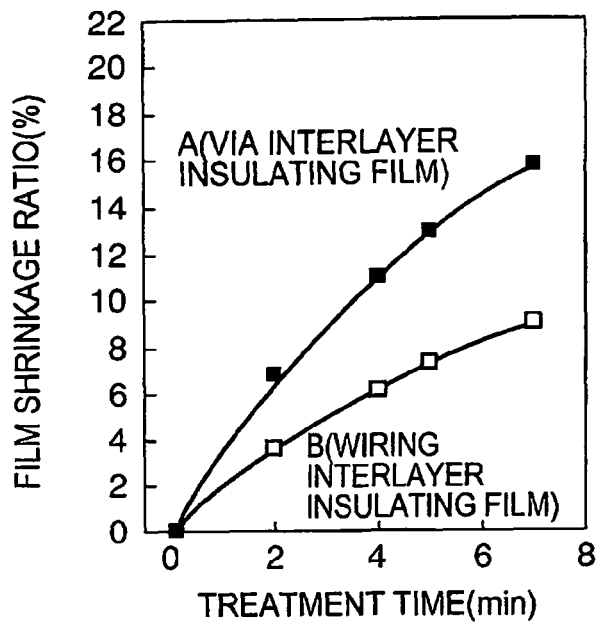
FIG. 25 shows the electron-beam irradiation time dependence of film shrinkage ratio of a film A and a film B.
Figure 26:
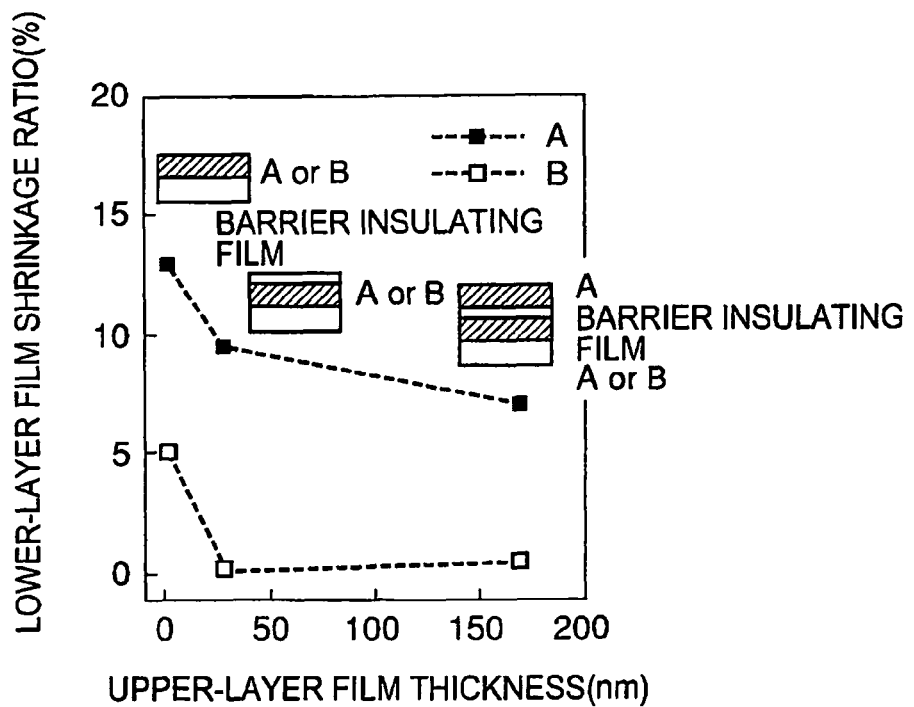
FIG. 26 shows the upper-layer film thickness dependence of film shrinkage ratio of the film A and the film B.

FIG. 25 shows the treatment time dependence of film shrinkage ratio when an electron beam is directly irradiated onto the surface of each of the above two films. Clearly, the film shrinkage of the film B for the wiring interlayer insulating film is smaller and thus its sensitivity to the electron beam is lower. FIG. 26 shows the results of evaluating the influence of overcure on the lower-layer film by simulating the actual wiring forming process. Herein, the film shrinkage of the lower-layer film (A or B) after irradiating an electron beam for 5 minutes as shown in FIG. 25 was evaluated by X-ray reflectance measurement. As described above, the film shrinkage of the film B is smaller when the electron beam is directly irradiated onto the film A and the film B. Then, when a barrier insulating film is formed to 30 nm on the film A and the film B and an electron beam is irradiated from above the upper layer, the lower-layer film A shrinks by approximately 9.4%, while, the film B hardly shrinks. Further, when a barrier insulating film (30 nm) and a film A are formed on the film A and the film B and an electron beam is irradiated, the film shrinkage of the lowermost layer A is 7.1%. On the other hand, it is seen that when the film B is applied to the lowermost layer, the film shrinkage hardly occurs. That is, by applying the two insulating films shown in Table 2 to the via and wiring interlayer insulating films, the influence of overcure can be effectively reduced. This result was also observed in the same manner when an ultraviolet ray was irradiated. The effect of cure increases for either of the film A and the film B as the wavelength of ultraviolet light decreases. The wavelength is preferably 150 to 275 nm as described before and more preferably 150 to 180 nm.

Figure 27:
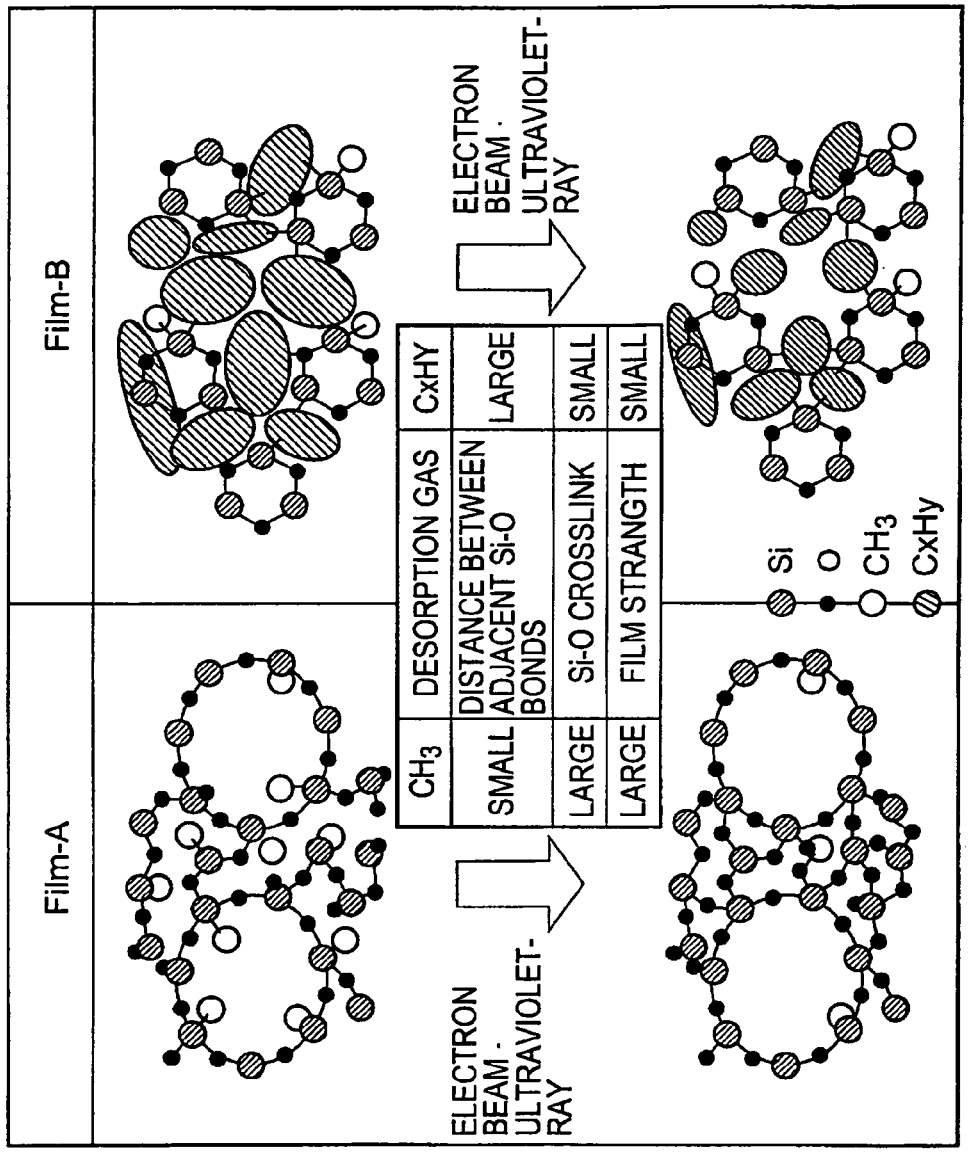
FIG. 27 is a schematic view showing strengthening mechanisms of the film A and the film B.
Figure 28:
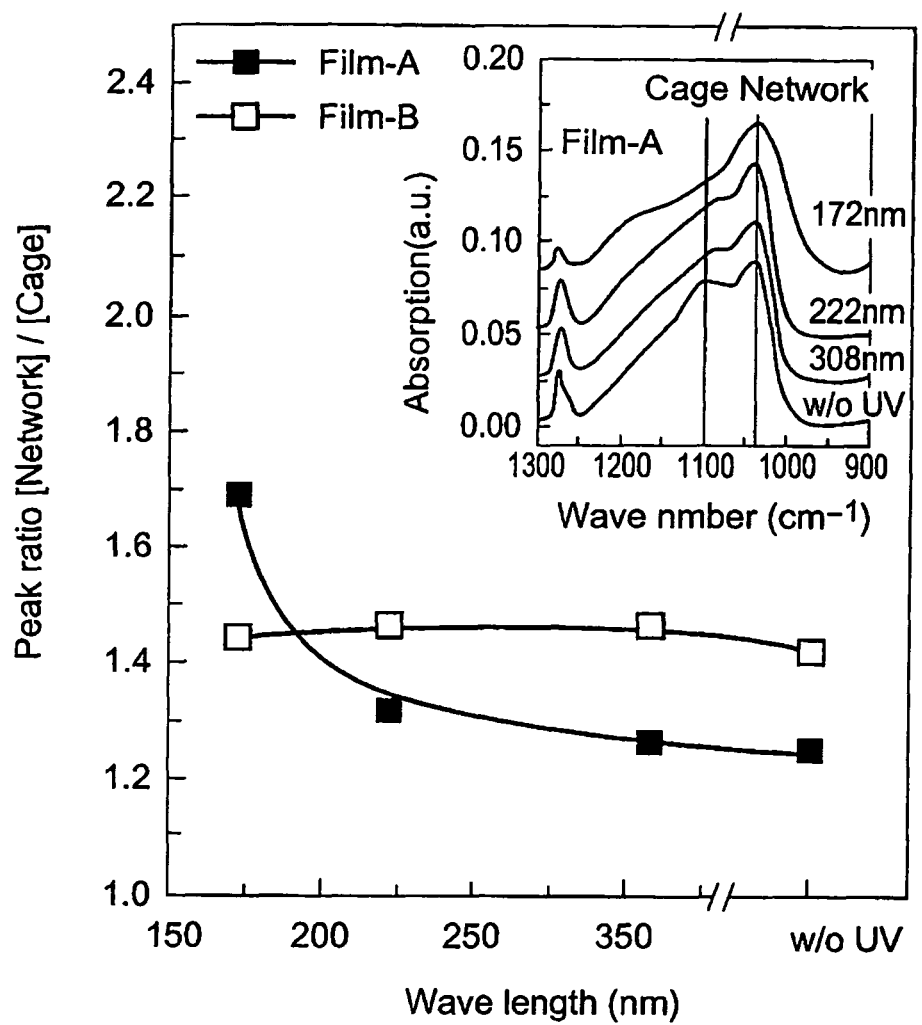
FIG. 28 shows the UV wavelength dependence of FTIR spectrum of the film A and the film B.

A mechanism in which the overcure is suppressed by using as the wiring interlayer insulating film the film B with the high carbon atom content and the small pore size is such that, as shown in FIG. 27, SiO bonds forming six-membered rings are localized through many hydrocarbons. Therefore, the distance between the adjacent SiO bonds is large and thus the crosslinking of SiO—Si does not easily occur as compared with the film A. As shown in FIG. 28, the FTIR network-type SiO—Si peak intensity serving as an index of the crosslinking of SiO—Si significantly increases in the film A when short-wavelength UV light is irradiated. Therefore, the sensitivity to cure can be lowered as the hydrocarbon content increases. Further, since the pore size of the film B is as extremely small as 0.4 nm, it is possible to suppress desorption of hydrocarbons into the pores which becomes important for strengthening (SiO—Si crosslinking).

Figure 29:
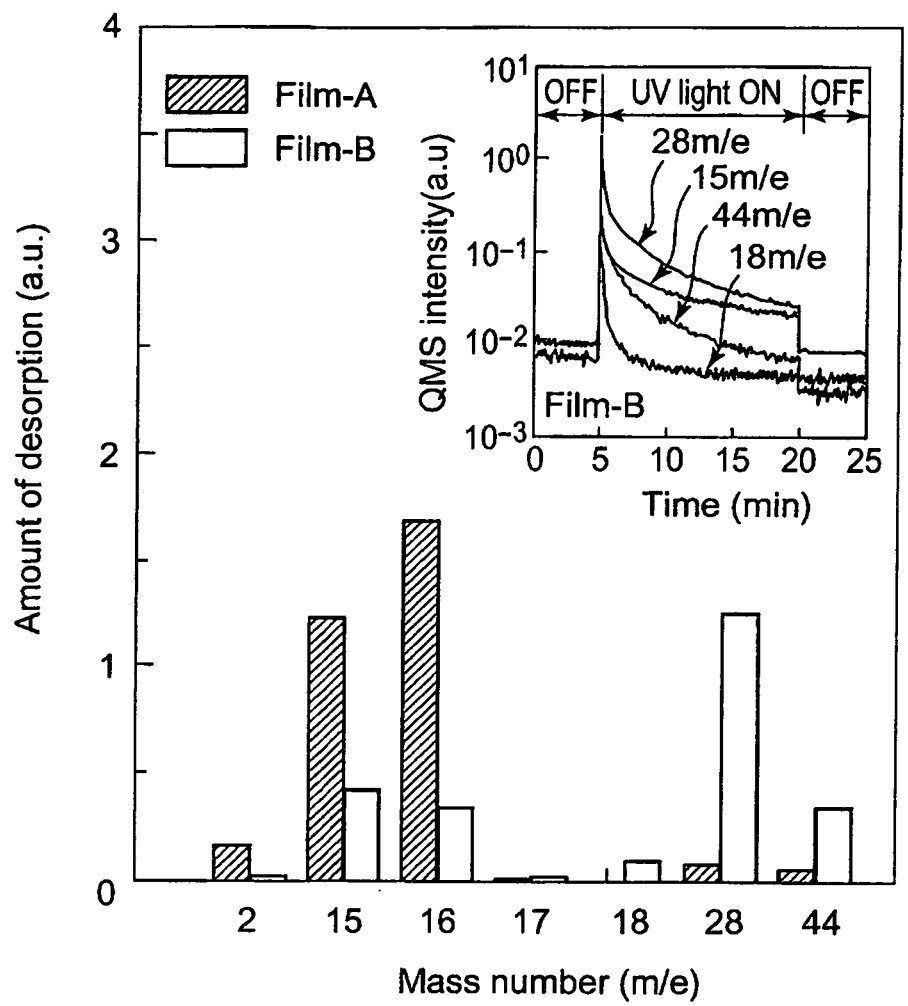
FIG. 29 shows the gas desorption characteristics of the film A and the film B in the UV irradiation.
Figure 30:
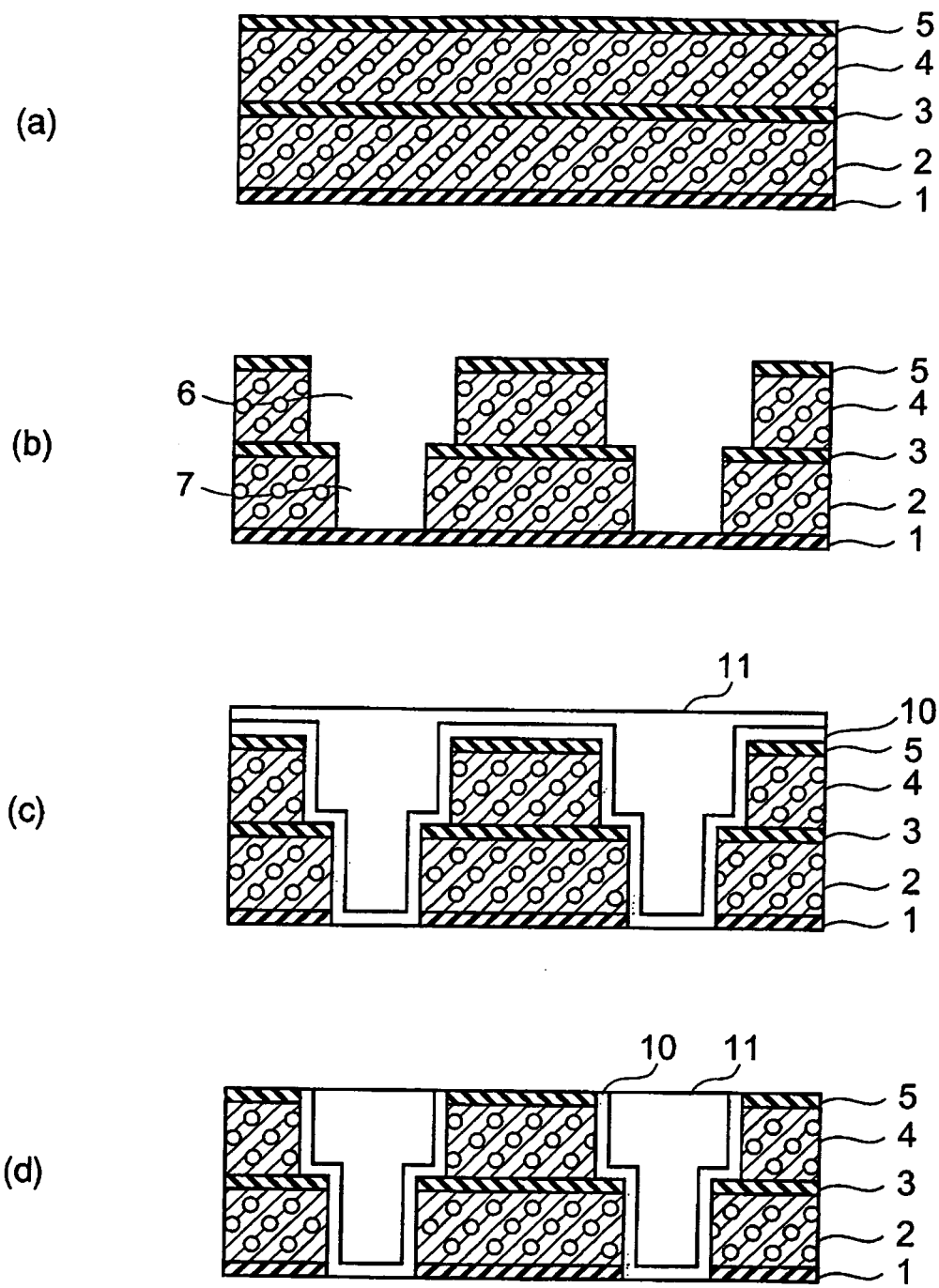
FIG. 30 is sectional structural views relating to a semiconductor device manufacturing method according to a prior art.

FIG. 29 shows the results of evaluating the gas desorption characteristics when UV light is directly irradiated onto the film A and the film B. By the UV cure, desorption of hydrocarbons from the films is clearly detected. Specifically, $CH_3$ (15 m/e) and $CH_4$ (16 m/e) from the film A and $C_2H_4$ from the film B are detected as main desorbed species. However, as also shown in FIG. 24, when an electron beam or an ultraviolet ray is irradiated onto the via interlayer insulating film 2, the lower-layer wiring insulating film 4 is shielded from the air by the dense hard mask 5 and barrier insulating film 1. In the film A having the relatively large pore size, hydrocarbons are released also into the pores in the film so that the recombination of the SiO bonds occurs, while, in the film B, since the pore size is small, gas release into the pores is suppressed. Therefore, by applying to the wiring interlayer insulating film the insulating film in which the pore size is small or the ratio of the number of carbon atoms to the number of silicon atoms is large, it is possible to realize higher strength and higher adhesion of the via interlayer insulating film while avoiding the influence of overcure.

With respect to the pore size and the ratio of the number of carbon atoms to the number of silicon atoms in the wiring interlayer insulating film with which the effects of this invention are obtained, taking into account the errors in the respective evaluation techniques, the pore size is approximately 0.5 nm or less and the ratio of the number of carbon atoms to the number of silicon atoms is approximately 3 or more. The material of the film contains SiO bonds, wherein the SiO structure in the film may be random. However, by having a cyclic structure such as a six-membered ring or an eight-membered ring, the SiO bonds can be more localized through hydrocarbons (SiO—Si crosslinking can be suppressed) and, therefore, the effects of this invention can be easily obtained. Although the wiring interlayer insulating film having the above properties slightly decreases in film strength improving effect as compared with the via interlayer insulating film A, it is possible to sufficiently achieve the effects of this invention such as the removal of the remaining etching gas on the etching opening side walls and the increase in adhesion to the adjacent film.

From the foregoing results, by applying the insulating films having different film properties (pore size, carbon content) to the wiring interlayer insulating film and the via interlayer insulating film, it is possible to realize still higher reliability and performance.

INDUSTRIAL APPLICABILITY

This invention is applicable to supercomputers and digital home appliances requiring high calculation speeds, mobile devices such as portable telephones requiring low power consumption, and so on.

The invention claimed is:

1. A semiconductor device manufacturing method for manufacturing a semiconductor device having a transistor mounted in a wiring of a plural-layer structure, said method comprising:
   in manufacturing the semiconductor device that is formed on a semiconductor element and comprises a barrier insulating film, a porous interlayer insulating film, a wiring, a via plug formed by embedding a metal wiring material in a wiring trench, and a via hole formed in said porous interlayer insulating film,
   etching said porous interlayer insulating film to form an opening in said porous interlayer insulating film;

irradiating an electron beam or an ultraviolet ray onto a side wall of said opening to form a porous modified layer on the side wall;

forming another opening in said barrier insulating film; and forming a barrier metal so as to contact with the porous modified layer, wherein a size of pores contained in the porous modified layer is greater than a size of pores contained in said porous interlayer insulating film before the irradiation of electron beam or ultraviolet ray, wherein the porous modified layer is formed as a support so as to surround the metal wiring material, and wherein concave/convex portions are formed by an increase in the size of the pores contained in the porous modified layer so as to improve adhesion between said porous interlayer insulating film and the barrier metal by an anchoring effect.

2. A semiconductor device manufacturing method according to claim 1, further comprising:

irradiating the electron beam or the ultraviolet ray after forming a via interlayer insulating film as said porous interlayer insulating film surrounding a side surface of said via plug, after forming a wiring interlayer insulating film as said porous interlayer insulating film surrounding a side surface of said wiring, or after forming said via interlayer insulating film and forming said wiring interlayer insulating film.

3. A semiconductor device manufacturing method according to claim 2, further comprising:

a first irradiation irradiating the electron beam or the ultraviolet ray after forming said via interlayer insulating film, after forming said wiring interlayer insulating film, or after forming said via interlayer insulating film and forming said wiring interlayer insulating film, and a second irradiation etching said wiring interlayer insulating film and said via interlayer insulating film to form said opening and then irradiating the electron beam or the ultraviolet ray onto a side wall of said opening.

4. A semiconductor device manufacturing method according to claim 1, wherein an arrival energy of electrons in the irradiating of the electron beam is 0.25 keV or more and 20 keV or less.

5. A semiconductor device manufacturing method according to claim 1, wherein a wavelength of ultraviolet light in the irradiating of the ultraviolet ray is 150 nm to 275 nm.

6. A semiconductor device manufacturing method according to claim 1, wherein a temperature of a substrate of the semiconductor device in the irradiating of the electron beam or the ultraviolet ray is set to 200° C. to 450° C.

7. A semiconductor device manufacturing method according to claim 1, wherein an irradiation is performed by inclining and rotating a substrate of the semiconductor device in the irradiating of the electron beam or the ultraviolet ray.

8. A semiconductor device manufacturing method according to claim 1, wherein an insulating film, having a pore size smaller than that of a via interlayer insulating film as said porous interlayer insulating film surrounding a side surface of said via plug, or an insulating film in which a ratio of a number of carbon atoms to a number of silicon atoms is greater than that in said via interlayer insulating film, is applied to at least a wiring interlayer insulating film as said porous interlayer insulating film surrounding a side surface of said wiring.

9. A semiconductor device manufacturing method according to claim 8, wherein said wiring interlayer insulating film has a pore size of 0.5 nm or less.

10. A semiconductor device manufacturing method according to claim 8, wherein the ratio of the number of carbon atoms to the number of silicon atoms in said wiring interlayer insulating film is three or more.

11. A semiconductor device manufacturing method according to claim 8, wherein said wiring interlayer insulating film comprises a material comprising cyclic SiO bonds and a hydrocarbon bonded to a side chain of said cyclic SiO bonds.

12. A semiconductor device manufacturing method according to claim 11, wherein said cyclic SiO bonds form a six-membered ring or an eight-membered ring.

13. A semiconductor device manufacturing method according to claim 1, wherein said porous modified layer extends at least in a portion of said porous interlayer insulating film.

14. A semiconductor device manufacturing method according to claim 1, wherein a ratio of a number of carbon atoms to a number of silicon atoms in said porous modified layer is less than a ratio of a number of carbon atoms to a number of silicon atoms in said porous interlayer insulating film.

15. A semiconductor device manufacturing method according to claim 14, wherein a ratio of a number of oxygen atoms to a number of silicon atoms in said porous modified layer is more than a ratio of a number of oxygen atoms to a number of silicon atoms in said porous interlayer insulating film.

16. A semiconductor device manufacturing method according to claim 1, wherein said forming the barrier metal comprises disposing the barrier metal on a surface of said porous modified layer.

* * * * *